United States Patent
Lee et al.

(10) Patent No.: US 12,419,060 B2
(45) Date of Patent: Sep. 16, 2025

(54) DATA STORAGE CELL, MEMORY, AND MEMORY FABRICATION METHOD THEREOF

(71) Applicant: UNITED MICROELECTRONICS CORP., Hsin-Chu (TW)

(72) Inventors: Kuo-Hsing Lee, Hsinchu County (TW); Sheng-Yuan Hsueh, Tainan (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 18/433,347

(22) Filed: Feb. 5, 2024

(65) Prior Publication Data
US 2024/0215264 A1 Jun. 27, 2024

Related U.S. Application Data

(63) Continuation of application No. 17/074,584, filed on Oct. 19, 2020, now Pat. No. 11,956,974.

(30) Foreign Application Priority Data
Aug. 19, 2020 (CN) .......... 202010835714.X

(51) Int. Cl.
*H01L 29/06* (2006.01)
*H10B 61/00* (2023.01)
(Continued)

(52) U.S. Cl.
CPC .......... *H10B 63/30* (2023.02); *H10B 61/22* (2023.02); *H10B 63/80* (2023.02); *H10N 50/01* (2023.02); *H10N 70/011* (2023.02)

(58) Field of Classification Search
CPC ........ H10B 61/22; H10B 63/80; H10B 53/40; H10N 50/01; H10N 70/011; H10N 70/20;
(Continued)

(56) References Cited

U.S. PATENT DOCUMENTS 5,771,190 A * 6/1998 Okamura .............. G11C 11/419
365/189.11
8,174,874 B2 5/2012 Inaba
(Continued)

FOREIGN PATENT DOCUMENTS

CN 112992904 A 6/2021
EP 3 944 248 A1 1/2022
(Continued)

OTHER PUBLICATIONS

Sneha et al., Analysis of 6T-SRAM Cell Designs Using MOS and FGMOS for Low Power Applications, U.S. Appl. No. 04/032,016, vol. 6 (Year: 2016).*
(Continued)

*Primary Examiner* — Ismail A Muse
(74) *Attorney, Agent, or Firm* — Winston Hsu

(57) ABSTRACT

The invention discloses a data storage cell. The data storage cell includes a storage structure, a first transistor, and a second transistor. A first end of the storage structure is electrically connected to a bit line. The first transistor includes a first gate, a first drain, and a first source. The second transistor includes a second gate, a second drain, and a second source. The first gate is electrically connected to the second gate. A second end of the storage structure is electrically connected to the first drain and the second drain. The first source and the second source are electrically connected to a source line.

15 Claims, 23 Drawing Sheets

(51) Int. Cl.
*H10B 63/00* (2023.01)
*H10N 50/01* (2023.01)
*H10N 70/00* (2023.01)

(58) Field of Classification Search
CPC ... G11C 11/1659; G11C 11/1657; G11C 8/14; H10D 89/10
See application file for complete search history.

(56) References Cited

U.S. PATENT DOCUMENTS

| | | | | |
|---|---|---|---|---|
| 9,786,363 | B1* | 10/2017 | Hong | G11C 11/419 |
| 10,446,224 | B2* | 10/2019 | Yamaoka | G11C 5/148 |
| 10,726,896 | B1* | 7/2020 | Jacob | G11C 11/1673 |
| 2003/0155607 | A1 | 8/2003 | Kamigaki | |
| 2004/0089913 | A1 | 5/2004 | Yano | |
| 2005/0219900 | A1 | 10/2005 | Kamigaki | |
| 2005/0226040 | A1* | 10/2005 | Zhu | H10N 50/10 365/158 |
| 2006/0228859 | A1 | 10/2006 | Willer | |
| 2006/0289945 | A1 | 12/2006 | Nii | |
| 2008/0239796 | A1* | 10/2008 | Aoki | G11C 11/1657 365/158 |
| 2009/0212340 | A1 | 8/2009 | Lee | |
| 2009/0273966 | A1* | 11/2009 | Gogl | G11C 11/1675 365/158 |
| 2011/0069534 | A1 | 3/2011 | Inaba | |
| 2011/0110148 | A1 | 5/2011 | Liu | |
| 2015/0076578 | A1* | 3/2015 | Sakamoto | H10B 41/20 257/300 |
| 2016/0225429 | A1 | 8/2016 | Toh | |
| 2016/0225818 | A1 | 8/2016 | Toh | |
| 2016/0322090 | A1* | 11/2016 | Chan | H10B 61/20 |
| 2018/0190180 | A1 | 7/2018 | Shang | |
| 2019/0355788 | A1 | 11/2019 | Chang | |
| 2020/0043941 | A1 | 2/2020 | Kim | |
| 2020/0090722 | A1 | 3/2020 | Lee | |
| 2020/0098931 | A1 | 3/2020 | Sharma | |
| 2020/0202956 | A1 | 6/2020 | Deguchi | |
| 2020/0411523 | A1 | 12/2020 | Shin | |
| 2020/0411553 | A1 | 12/2020 | Zhang | |
| 2021/0036056 | A1 | 2/2021 | Park | |
| 2021/0090627 | A1* | 3/2021 | Gupta | G11C 11/1657 |
| 2021/0183861 | A1 | 6/2021 | Lee | |
| 2022/0358981 | A1* | 11/2022 | Wang | H10B 61/22 |

FOREIGN PATENT DOCUMENTS

| | | |
|---|---|---|
| JP | 2007-287736 A | 11/2007 |
| WO | 2021/149586 A1 | 7/2021 |

OTHER PUBLICATIONS

Chien-Yu Lu et al., A 0.325 V, 600-KHz, 40-nm 72-kb 9T Sub-threshold SRAM with Aligned Boosted Write Wordline and Negative Write Bitline Write-Assist, Transactions Briefs, IEEE Transactions on Very Large Scale Integration(VLSI) Systems, vol. 23, No. 5, May 2015, 2014 IEEE, pp. 958-962, XP011579390 ,May 2015.

* cited by examiner

DATA STORAGE CELL, MEMORY, AND MEMORY FABRICATION METHOD THEREOF

CROSS REFERENCE TO RELATED APPLICATIONS

This application is a continuation application of U.S. Application Ser. No. 17/074,584, filed on Oct. 19, 2020. The content of the application is incorporated herein by reference.

BACKGROUND OF THE INVENTION

1. Field of the Invention

The present invention relates to a data storage cell, a memory, and a memory fabrication method thereof, and more particularly, to a data storage cell, a memory and a memory fabrication method thereof with higher reliability.

2. Description of the Prior Art

The field of semiconductor memory has recently received increased attention. Semiconductor memory may be volatile or nonvolatile. A nonvolatile semiconductor memory may retain data even when not powered and therefore are widely applied in cellular phones, digital cameras, personal digital assistants, mobile computing devices, non-mobile computing devices and other electronic devices.

In a memory, the length of each word line may cause non-negligible power consumption and affect the voltage(s) provided by it to the corresponding data storage cell of the memory, thereby leading to instability in writing or reading operations. Moreover, a plurality of layers may be disposed between the gate of one of the data storage cells and one of the word lines, and thus make the electric potential of one gate different from that of another. When manufacture process defect(s) forms in one gate electrode line, signal transmission abnormalities may occur. Therefore, how to optimize the layout design of the word lines has become an important issue.

SUMMARY OF THE INVENTION

Consequently, the present invention mainly provides a data storage cell, a memory, and a memory fabrication method thereof to improve reliability.

The present invention further discloses a data storage cell. The data storage cell comprises a storage structure, a first transistor, and a second transistor. A first end of the storage structure is electrically connected to a bit line. The first transistor comprises a first gate, a first drain, and a first source. The second transistor comprises a second gate, a second drain, and a second source. The first gate is electrically connected to the second gate. A second end of the storage structure is electrically connected to the first drain and the second drain. The first source and the second source are electrically connected to a source line.

The present invention further discloses a memory. The memory comprises a plurality of data storage cells arranged in an array, a plurality of first conductive lines, and a plurality of source lines. A plurality of gates of the plurality of data storage cells respectively constitute a plurality of gate electrode lines. Each of the plurality of first conductive lines is coupled to two of the plurality of gate electrode lines, and each of the plurality of first conductive lines at least partially overlaps the two gate electrode lines of the plurality of gate electrode lines. The plurality of source lines are parallel to the plurality of first conductive lines, and two of the plurality of first conductive lines respectively adjacent to opposite sides of one of the plurality of source lines are staggered and non-aligned.

These and other objectives of the present invention will no doubt become obvious to those of ordinary skill in the art after reading the following detailed description of the preferred embodiment that is illustrated in the various figures and drawings.

DETAILED DESCRIPTION

Please note that the figures are only for illustration and the figures may not be to scale. The scale may be further modified according to different design considerations. When referring to the terms "up" or "down" that describe the relationship between components in the text, it is well known in the art and should be clearly understood that these words refer to relative positions that may be inverted to obtain a similar structure. The connection between components may involve direct contact or indirect contact. All these possibilities should therefore not be precluded from the scope of the claims in the present invention.

In the following description and claims, the terms "include" and "comprise" are used in an open-ended fashion, and thus should be interpreted to mean "include, but not limited to". Use of ordinal terms such as "first" and "second" does not by itself connote any priority, precedence, or order of one element over another or the chronological sequence in which acts of a method are performed, but are used merely as labels to distinguish one element having a certain name from another element having the same name. Different technical features described in the following embodiments may be mixed or combined in various ways if they are not conflict to each other.

Figure 1:
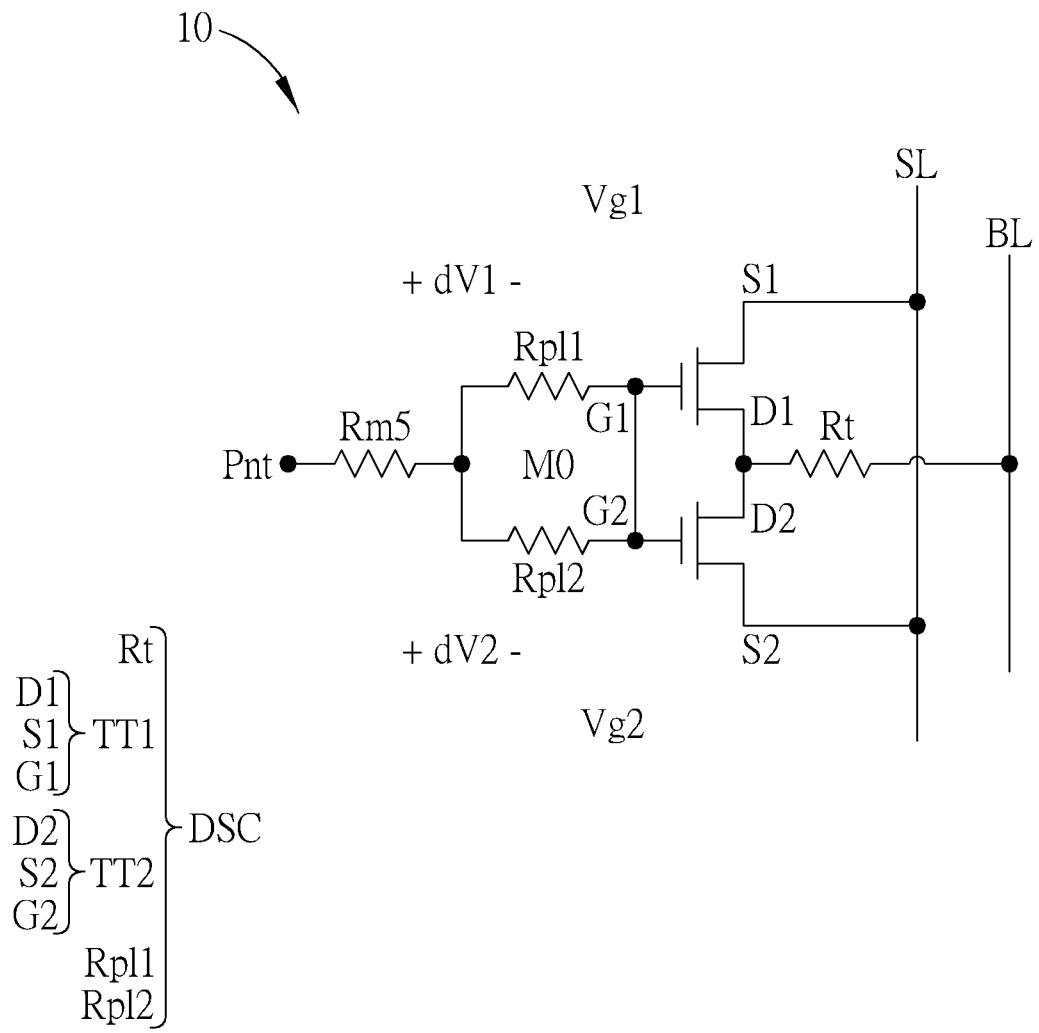
FIG. 1 and FIG. 2 are schematic diagrams of an equivalent circuit of a memory according to an embodiment of the present invention respectively.

Please refer to FIG. 1, which is a schematic diagram of an equivalent circuit of a memory 10 according to an embodiment of the present invention. The memory 10 may include a data storage cell DSC, a source line SL, a bit line BL, a conductive line M0 (also referred to as a first conductive line), and a conductive line (for instance, the conductive line M5 shown in FIG. 3) (also referred to as a second conductive line) corresponding to a resistance Rm5. The data storage cell DSC may include a storage structure Rt, transistors TT1, TT2, and resistors Rpl1, Rpl2. The transistor TT1 (also referred to as a first transistor) includes a gate G1 (also referred to as a first gate), a drain D1 (also referred to as a first drain), and a source S1 (also referred to as the first source). The transistor TT2 (also referred to as a second transistor) includes a gate G2 (also referred to as a second gate), a drain D2 (also referred to as a second drain) and a source S2 (also referred to as a second source).

Briefly, the second conductive line corresponding to the resistor Rm5 may serve as a word line, which may cause power consumption. Therefore, the resistance of the resistor Rm5 is reduced in the present invention to reduce the voltage (also referred to as cross-voltage) across the resistor Rm5. In addition, a plurality of layers (for instance, conductive layers M2 and M4 shown in FIG. 19) may be disposed between the gate of one transistor (for instance, the gate G1 of the transistor TT1 or the gate G2 of the transistor TT2) and the corresponding word line. These layers may make the electric potential of the gate G1 different from that of the gate G2. Because the conductive line M0 may be directly connected between/to the gates G1 and G2 in the present invention, the electric potential of the gate G1 of the transistor TT1 may equal the electric potential of the gate G2 of the transistor TT2, thereby improving reliability.

Specifically, the word line may have a word line voltage input terminal Pnt, which is configured to receive word line voltage (for instance, from a control circuit). The gate G1 is electrically connected to the gate G2. For example, the gate G1 is electrically connected to (for instance, being directly connected to and contacting) the gate G2 through the conductive line M0. Accordingly, a first (electric) potential difference dV1 between the gate G1 and the word line voltage input terminal Pnt is equal to a second potential difference dV2 between the gate G2 and the word line voltage input terminal Pnt. The gates G1 and G2 have substantially the same electric potential; that is, the electric potential Vg1 of the gate G1 is equal to the electric potential Vg2 of the gate G2.

With the conductive line M0, the gates G1 and G2 of the transistors TT1 and TT2 may be electrically connected to (for instance, is directly connected to and contacts) a first end of a resistor Rpl1 (also referred to as a first resistor), and the gates G1 and G2 of the transistors TT1 and TT2 may be electrically connected to (for instance, is directly connected to and contacts) a first end of a resistor Rpl2 (also referred to as a second resistor). A second end of the resistor Rpl1 and a second end of the resistor Rpl2 are electrically connected to the word line voltage input terminal Pnt through the resistor Rm5 corresponding to the second conductive line. Accordingly, the gates G1 and G2 of the transistors TT1 and TT2 are coupled to the same word line. In some embodiments, the transistors TT1 and TT2 may be connected in parallel. The sources S1 and S2 of the transistors TT1 and TT2 may be electrically connected to the source line SL. The drain D1 and D2 may be electrically connected to a second end of the storage structure Rt.

In some embodiments, part of the second conductive line may constitute the resistance Rm5. In some embodiments, the resistance of the resistor Rm5 corresponding to the second conductive line may be one fifth of that in the conventional technology. For example, the resistance of the resistor Rm5 may be in a range of 10 ohms to 1280 ohms. In terms of the 28 nm process technology, the resistance of the resistor Rm5 may be in a range of 10 ohms to 640 ohms. For example, when there are 64 bit lines BL between two adjacent ones of the word line voltage input terminals Pnt, the resistance of the resistor Rm5 may be 10 ohms. When there are 4096 bit lines BL between two adjacent ones of the word line voltage input terminals Pnt, the resistance of the resistor Rm5 may be 640 ohms. In terms of the 14-nanometer manufacture process, the resistance of the resistor Rm5 may be in a range of 20 ohms to 1280 ohms. For example, when there are 64 bit lines BL between two adjacent ones of the word line voltage input terminals Pnt, the resistance of the resistor Rm5 may be 20 ohms. When there are 4096 bit lines BL between two adjacent ones of the word line voltage input terminals Pnt, the resistance of the resistor Rm5 may be 1280 ohms. In some embodiments, the resistance of the resistor Rm5 may be reduced by increasing the cross-sectional area (or thickness, or width) of the second conductive line or changing the material or trace routing scheme of the second conductive line. The increased cross-sectional area (or thickness, or width) may reduce loads along the second conductive line, such that the voltage drop along the second conductive line (or the voltage drop between the gate G1 or G2 and the word line voltage input terminal Pnt) is relatively lower.

A first end of the storage structure Rt is electrically connected to the bit line BL. In some embodiments, the storage structure Rt is configured to store a bit or bits of data. In some embodiments, the storage structure Rt may be a variable resistor to define internal data states. The resistance of the storage structure Rt may be changed by applying different voltages or currents to the storage structure Rt. The bit value may be read by determining the resistance of the storage structure Rt. For example, when the resistance of the memory structure Rt is in a low resistance state or a high resistance state, the bit value stored in the state may be designated a binary "1" or "0", but is not limited thereto. In some embodiments, the storage structure Rt may include a magnetic storage component, such as a magnetic tunnel junction (MTJ) component. In some embodiments, the memory 10 may be, for example, a resistive random-access memory (RRAM), a magnetic random access memory (MRAM), a ferroelectric random access memory (FeRAM), or a phase-change memory (PRAM), but is not limited thereto. In some embodiments, the memory 10 may be a non-volatile memory (NVM).

In this embodiment, the data storage cell DSC may be, for example, a two-transistor one-resistor (2T1R) bit cell to increase driving current, thereby speeding up writing or reading operation. In other embodiments, the data storage cell DSC may be, for example, a one-transistor two-resistor (1T1R) bit cell, a one-transistor one-capacitor (1T1C) bit cell, or a two-transistor one-capacitor (2T1C) bit cell, but is not limited thereto. In some embodiments, the transistors TT1 and TT2 of the data storage cell DSC may be, for example, metal-oxide-semiconductor field-effect transistor (MOSFET), insulated-gate field effect transistor (IGFET) or bipolar transistor, but is not limited thereto.

Figure 2:
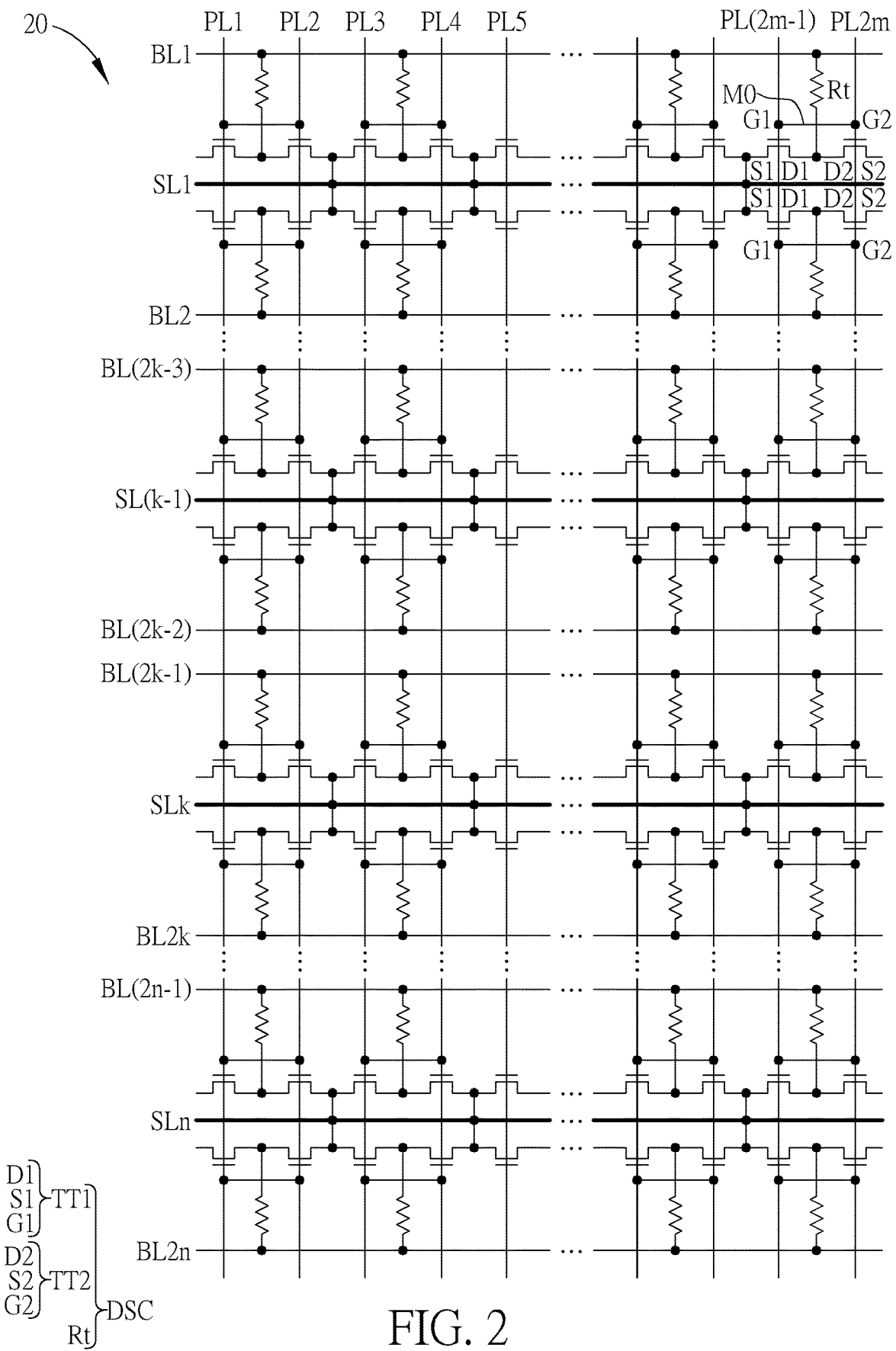
Figure 3:
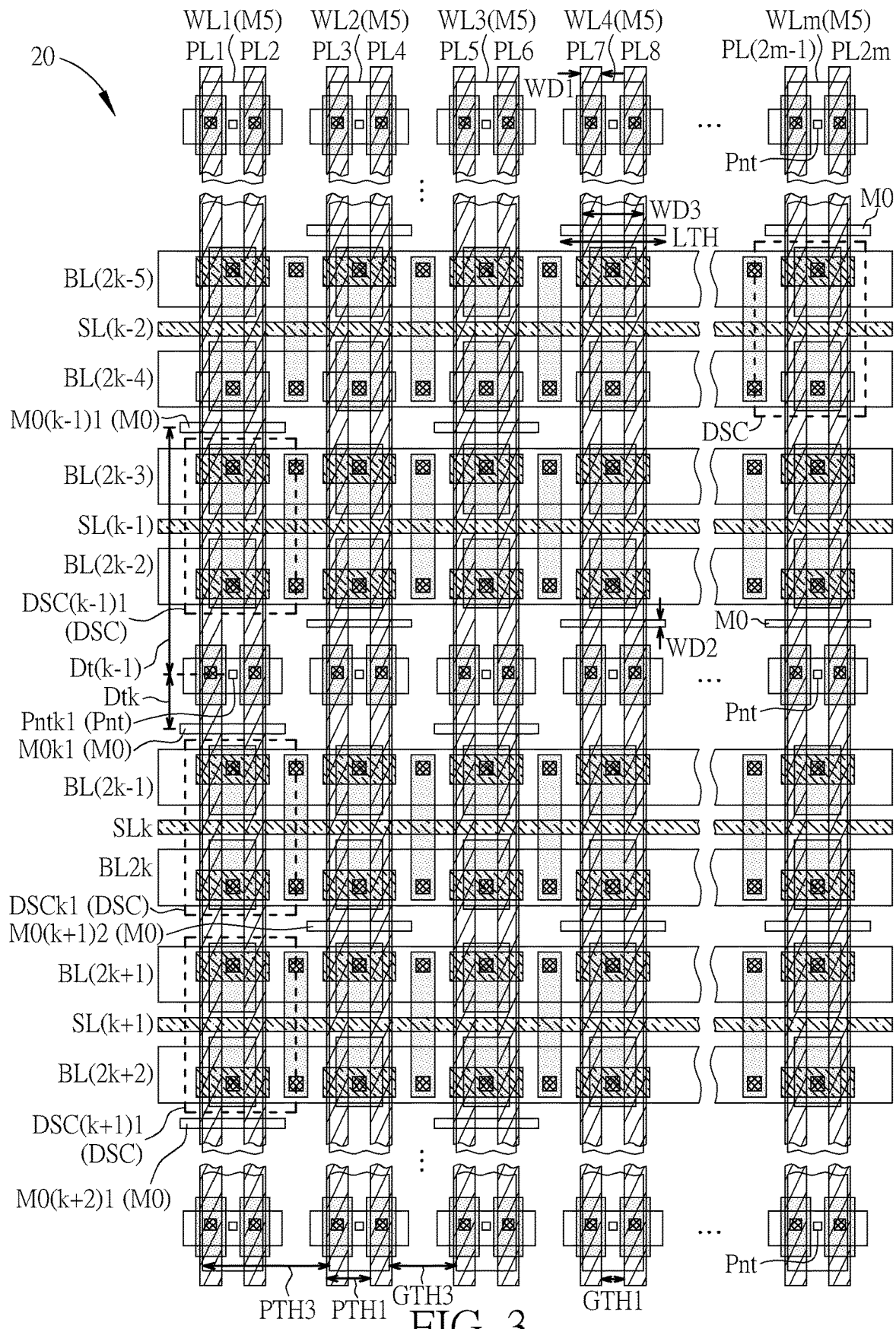
FIG. 3 is a schematic diagram of the memory shown in FIG. 2.

More specifically, please refer to FIG. 2 and FIG. 3. FIG. 2 is a schematic diagram of an equivalent circuit of a memory 20 according to an embodiment of the present invention, and FIG. 3 is a schematic diagram of the memory 20 shown in FIG. 2. The structure of the memory 20 shown in FIG. 2 is similar to that of the memory 10 shown in FIG. 1, and hence the same numerals and notations denote the same components in the following description. The memory 20 may include a plurality of data storage cells DSC, source lines SL1 to SLn (corresponding to the source line SL shown in FIG. 1), bit lines BL1 to BL2n (corresponding to the bit line BL shown in FIG. 1), and gate electrode lines PL1 to PL2m, and conductive lines M0, M5. The conductive lines M5 (also referred to as second conductive lines) may serve as word lines WL1 to WLm, respectively.

As shown in FIG. 2, the data storage cells DSC are arranged in an array. The gates G1 and G2 of the data storage cells (namely, the data storage cell DSC shown in FIG. 1) respectively form a part of the gate electrode lines PL1 to PL2m shown in FIG. 2. For example, the gate G1 of one of the data storage cells DSC forms a part of the gate electrode line PL(2m−1), the gate G2 of the data storage cell DSC forms a part of the gate electrode line PL2m. The gate electrode lines PL1 to PL2m extend (for instance, vertically) along the columns of the array. Similarly, the word lines WL1 to WLm partially formed from the conductive lines M5 extend (for instance, vertically) along the columns of the array, and are electrically connected to the data storage cells DSC in the corresponding column. The gate electrode lines PL1 to PL2m are parallel to the conductive lines M5 serving as the word lines WL1 to WLm. The source lines SL1 to SLn and the bit lines BL1 to BL2n extend (for instance, horizontally) along the rows of the array, and are electrically connected to the data storage cells DSC in the corresponding rows. In some embodiments, the word lines WL1 to WLm facilitate selection of the data storage cells DSC on a column-by-column basis, and the source lines SL1 to SLn and the bit lines BL1 to BL2n facilitate reading from and/or writing to the selected data storage cell(s) DSC on a row-by-row basis, but is not limited thereto.

In some embodiments, every two of the gate electrode lines PL1 to PL2m are grouped into a set. The intersection of any two sets is an empty set; that is, one gate electrode line may not belong to different sets. One of the conductive lines M5 is coupled to the gate electrode lines in the same set. For example, the word line WLm is coupled to the gate electrode lines PL(2m−1) and PL2m adjacent to each other. In other words, each of the conductive lines M5 is coupled to two of the gate electrode lines PL1 to PL2m. In some embodiments, each of the conductive lines M5, which may constitute one of the word lines WL1 to WLm, may at least partially overlap two of the gate electrode lines PL1 to PL2m. For example, one of the conductive lines M5 partially overlaps the gate electrode lines PL(2m−1) and PL2m adjacent to the conductive line M5. As shown in FIG. 3, the conductive line M5 exposes, for example, the left side of the gate electrode line PL(2m−1) and the right side of the gate electrode line PL2m. Therefore, each of the conductive lines M5 does not completely overlap two of the gate electrode lines PL1 to PL2m. In some embodiments, a second pitch PTH3 between two adjacent ones of the conductive lines M5 is more than or equal to twice a first pitch PTH1 between two adjacent ones of the gate electrode lines PL1 to PL2m. A gap width GTH1 between two adjacent ones of the gate electrode lines PL1 to PL2m is less than or equal to a second width WD3 of one of the conductive lines M5. In some embodiments, the second pitch PTH3 between two adjacent ones of the conductive lines M5 may be 260 nanometers (nm), and a gap width GTH3 between two adjacent ones of the conductive lines M5 may be 120 nanometers.

Since the memory 20 may include a large number of data storage cells DSC, the length(s) of the word lines WL1 to WLm may make themselves have high load(s), which may cause non-negligible power consumption and affect the voltage(s) provided by the word lines WL1 to WLm to the data storage cells DSC. These in turn lead to instability in writing or reading operations. The resistance of one of the conductive lines M5 may be reduced by increasing the width of the conductive line M5, and the voltage (cross-voltage) across the conductive line M5 may be reduced by decreasing the resistance of the conductive line M5, thereby reducing line loading. In some embodiments, a first width WD1 of one of the gate electrode lines PL1 to PL2m is 0.2 to 0.5 times as large as the second width WD3 of one of the conductive lines M5, but is not limited thereto. In some embodiments, the second width WD3 of one of the conductive lines M5 may be 140 nanometers. In some embodiments, the gate electrode lines PL1 to PL2m may have different thicknesses or widths; the conductive lines M5 may have different thicknesses or widths.

In some embodiments, the conductive lines M0 may be evenly spaced apart along the rows of the array and extend in parallel (for instance, horizontally). The source lines SL1 to SLn and the bit lines BL1 to BL2n are parallel to the conductive lines M0. In some embodiments, at least one of the conductive lines M0 is electrically connected between/to (for instance, is directly connected between/to and contacts) or electrically shorts the gate electrode lines of the same set in the gate electrode lines PL1 to PL2m. For example, at least one of the conductive lines M0 is electrically connected between/to the gate electrode lines PL(2m−1) and PL2m adjacent to each other. In other words, each of the conductive lines M0 is coupled to two of the gate electrode lines PL1 to PL2m. In some embodiments, one conductive line M0 is coupled to only one word line. For example, the conductive line M0k1 is coupled to the word line WL1 alone. A plurality of layers (for instance, the conductive layers M2 and M4 shown in FIG. 19) may be disposed between the gate (for instance, the gate G1 or G2) of the data storage cell DSC or its corresponding gate electrode line and the word line (for instance, the word line WLm). The plurality of layers may make the electric potential of the gate (for instance, the gate G1) or its corresponding gate electrode line different from that of another gate (for instance, the gate G2) or its corresponding gate electrode line. Since one conductive line M0 is directly connected between/to the gates G1 and G2 or between their corresponding gate electrode lines (for instance, the gate electrode lines PL(2m−1) and PL2m), the electric potential of the gate G1 may equal the electric potential of the gate G2. In addition, when one conductive line M0 is directly connected between/to the gate electrode lines (for instance, the gate electrode lines PL(2m−1) and PL2m), it may further avoid signal transmission abnormalities (for instance, the voltage of the gate G1 located on the gate electrode line PL2m cannot be adjusted according to that of the word line WLm) caused by manufacture process defects in the gate electrode lines PL1 to PL2m (for instance, the gate electrode line PL2m is broken/fractured).

In some embodiments, each of the conductive lines M0 may at least partially overlap two of the gate electrode lines PL1 to PL2m so as to electrically connect between/to and contact the gate electrode lines. For example, at least one of the conductive lines M0 partially overlaps the gate electrode lines PL(2m−1) and PL2m adjacent to each other. In some embodiments, the first width WD1 of one of the gate electrode lines PL1 to PL2m is 0.5 to 1 times as large as a second width WD2 of one of the conductive lines M0, and the first width WD1 of one of the gate electrode lines PL1 to PL2m is 0.1 to 0.2 times as large as a length LTH of one of the conductive lines M0, but is not limited thereto. In some embodiments, the conductive lines M0 may have different lengths or widths, and the gate electrode lines PL1 to PL2m may have different lengths or widths. In some embodiments, the conductive lines M0, each coupled to the gate electrode lines of one set adjacent to another set, alternate but are nonaligned. For example, the conductive line M0k1 is coupled to the gate electrode lines PL1 and PL2 in one set, and the conductive lines M0(k+1)2 is coupled to the gate electrode lines PL3 and PL4 in another adjacent set. The conductive lines M0k1 and M0(k+1)2 interleave but do not align with each other. In some embodiments, the conductive lines M0 alternately arranged are electrically isolated from each other and not coupled to each other. For example, the conductive line M0k1 is electrically isolated from the conductive line M0(k+1)2 without being coupled to the conductive line M0(k+1)2.

In some embodiments, two adjacent ones of the conductive lines M0 in the same column may be separated by one (or more) of the data storage cells DSC in the same column. For example, the conductive lines M0(k−1)1 and M0k1, which are adjacent to each other and located in the same column, may be separated by the data storage cell DSC(k−1)1 (namely, one data storage cell DSC). Alternatively, the conductive lines M0k1 and M0(k+2)1, which are adjacent to each other and located in the same column, may be separated by the data storage cells DSCk1 and DSC(k+1)1 (namely, two data storage cells DSC). In some embodiments, the width of one of the data storage cells DSC may be 260 nanometers, and the height of one of the data storage cells DSC may be 420 nanometers. In this case, the distance between the conductive lines M0k1 and M0(k+2)1 may be 840 nanometers. In some embodiments, at least two adjacent ones of the bit lines BL1 to BL2n are located between two adjacent and aligned ones of the conductive lines M0. For example, the bit lines BL(2k−3) and BL(2k−2) (namely, two bit lines) are located between the conductive lines M0(k−1)1 and M0k1, which are adjacent to and aligned with each other. Alternatively, the bit lines BL(2k−1) to BL(2k+2) (namely, four bit lines) are located between the conductive lines M0k1 and M0(k+2)1, which are adjacent to and aligned with each other. In some embodiments, two of the conductive lines M0, which are adjacent to the opposite sides of one of the source lines SL1 to SLn respectively, are staggered and not aligned with each other. For example, the conductive lines M0k1 and M0(k+1)2 are adjacent to the two sides of the source lines SLk respectively and stagger without being aligned with each other. In some embodiments, one of the conductive lines M0 is perpendicular to or extends across one of the conductive lines M5. In some embodiments, one of the conductive lines M0, which overlaps one conductive line M5, is staggered and nonaligned with another of the conductive lines M0, which overlaps another conductive line M5. For example, the conductive line M0k1 overlapping the word line WL1 staggers and is not aligned with the conductive line M0(k+1)2 overlapping the word line WL2.

In some embodiments, a plurality of word line voltage input terminals Pnt may be configured on one word line (for instance, the word line WLm) to receive word line voltage (for instance, from the control circuit through the word line voltage input terminals Pnt). In some embodiments, the word line voltage input terminals Pnt in the same row constitute a logic region, and the data storage cells DSC are (completely) absent from the logic region. There are a plurality of bit lines disposed between two adjacent ones of the logic regions; that is, a plurality of data storage cells DSC are disposed between the two adjacent logic regions. For example, there may be 64 bit lines disposed between two adjacent ones of the logic regions. The larger the number of bit lines between two adjacent logic regions, the smaller the area of the memory 20. However, the voltage drop(s) of the conductive lines M5 may increase. In some embodiments, the word line voltage input terminals Pnt configured on the word lines WL1 to WLm are evenly spaced apart and arranged in an array, meaning that different logic regions are evenly spaced apart from each other. In some embodiments, each of the word lines WL1 to WLm extend continuously without being disconnected or broken apart at any of the word line voltage input terminals Pnt of the word line (or at any of the logic regions). In some embodiments, one of the word line voltage input terminals Pnt is separated from the neighboring conductive lines M0 on both sides by different distances. For example, there is a distance Dt(k−1) (also referred to as first distance) between the word line voltage input terminal Pntk1 and the conductive line M0(k−1) adjacent to one side of the word line voltage input terminal Pntk1. There is a distance Dtk (also referred to as second distance) between the word line voltage input terminal Pntk1 and the conductive line M0k1 adjacent to the opposite side of the word line voltage input terminal Pntk1. The distances Dt(k−1) and Dtk are unequal. In some embodiments, one (or more) of the data storage cells DSC (for instance, the data storage cells DSC(k−1)1) is disposed between one of the word line voltage input terminals Pnt (for instance, the word line voltage input terminals Pntk1) and the conductive line M0 (for instance, the conductive line M0(k−1)1) adjacent to one side of the word line voltage input terminal Pnt, but no data storage cell DSC is provided between the word line voltage input terminal Pnt and the conductive line M0 (for instance, the conductive line M0k1) adjacent to the opposite side of the word line voltage input terminal Pnt. .

Figure 4:
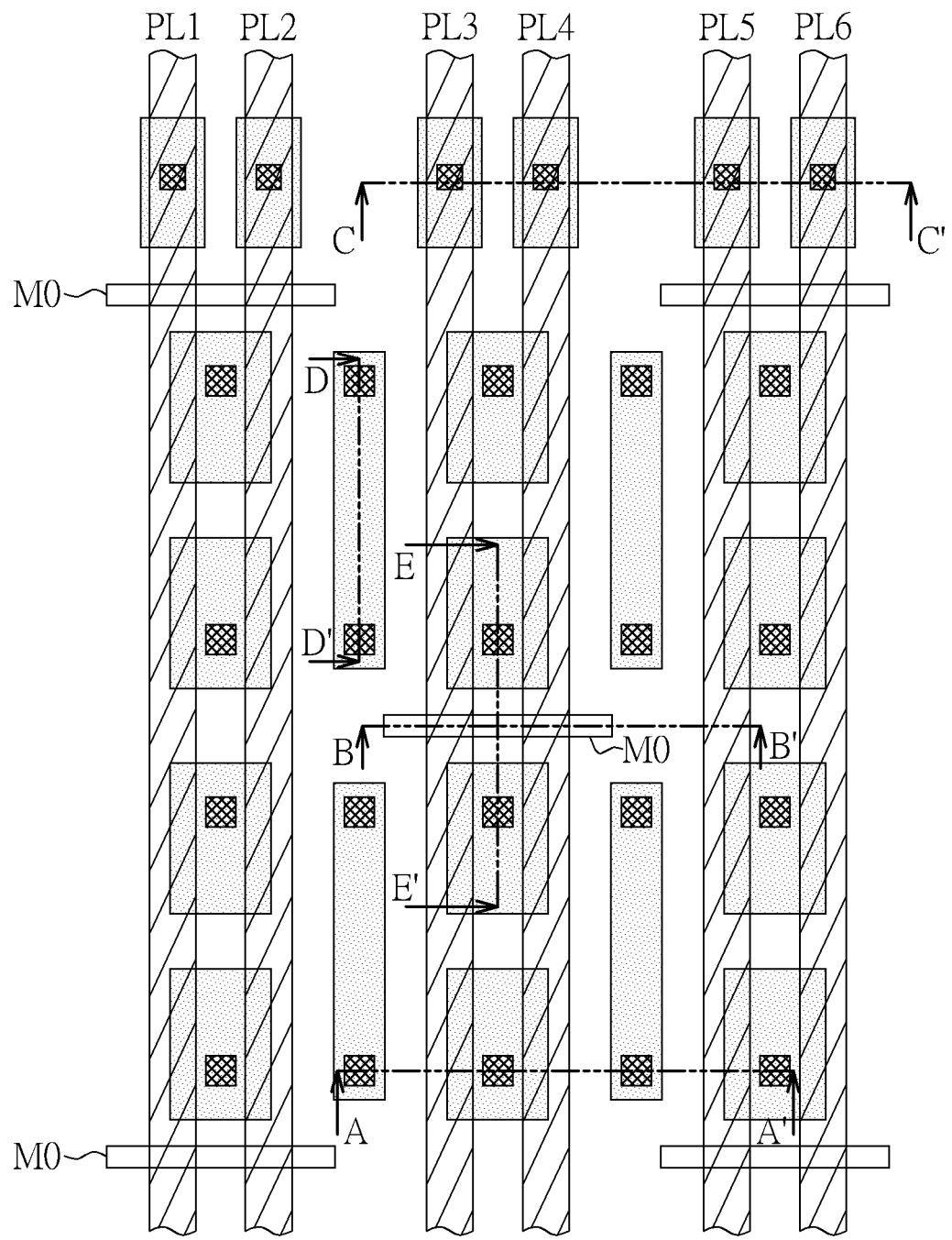
FIGS. 4 to 21 are schematic diagrams illustrating a memory fabrication method according to an embodiment of the present invention.
Figure 5:
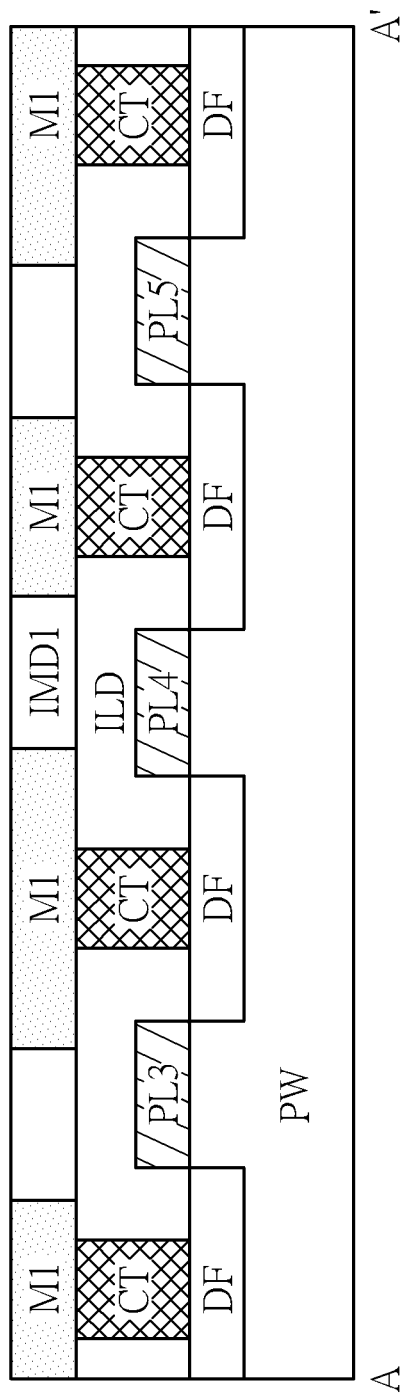
Figure 6:
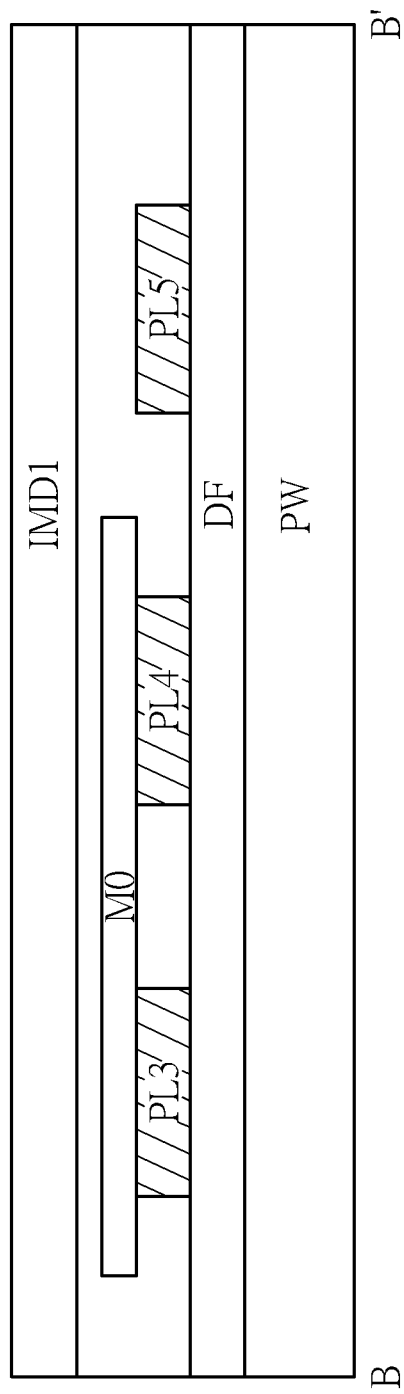
Figure 7:
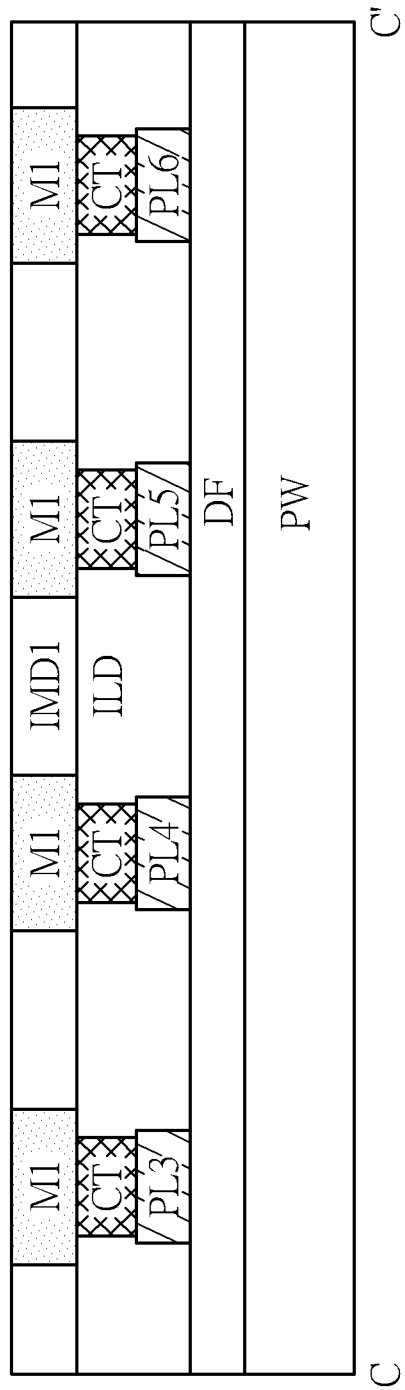
Figure 8:
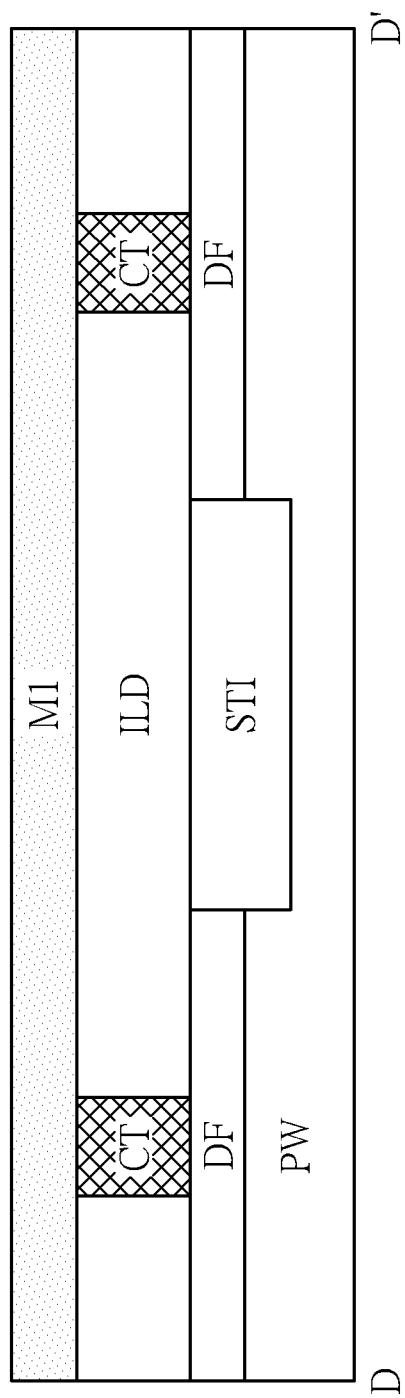
Figure 9:
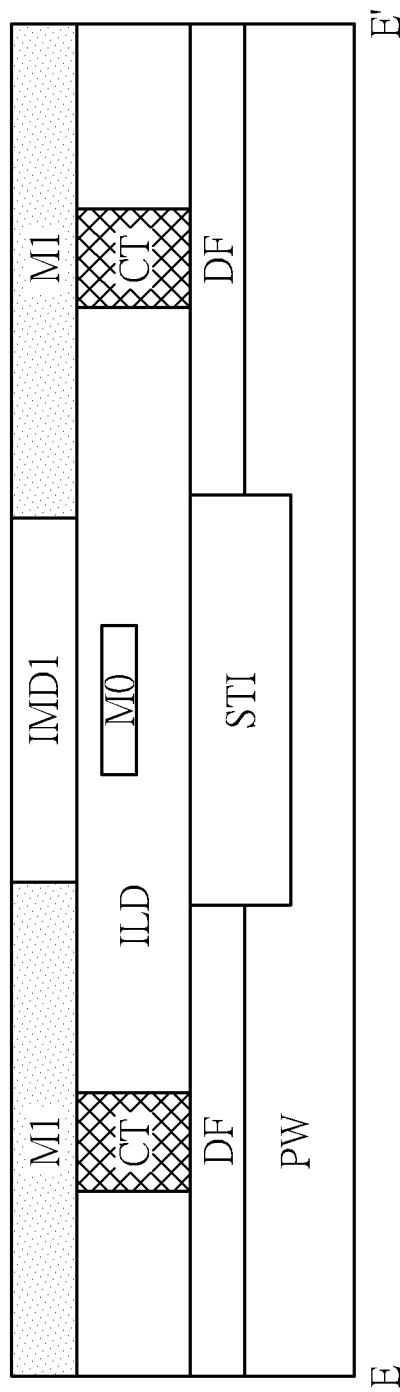
Figure 10:
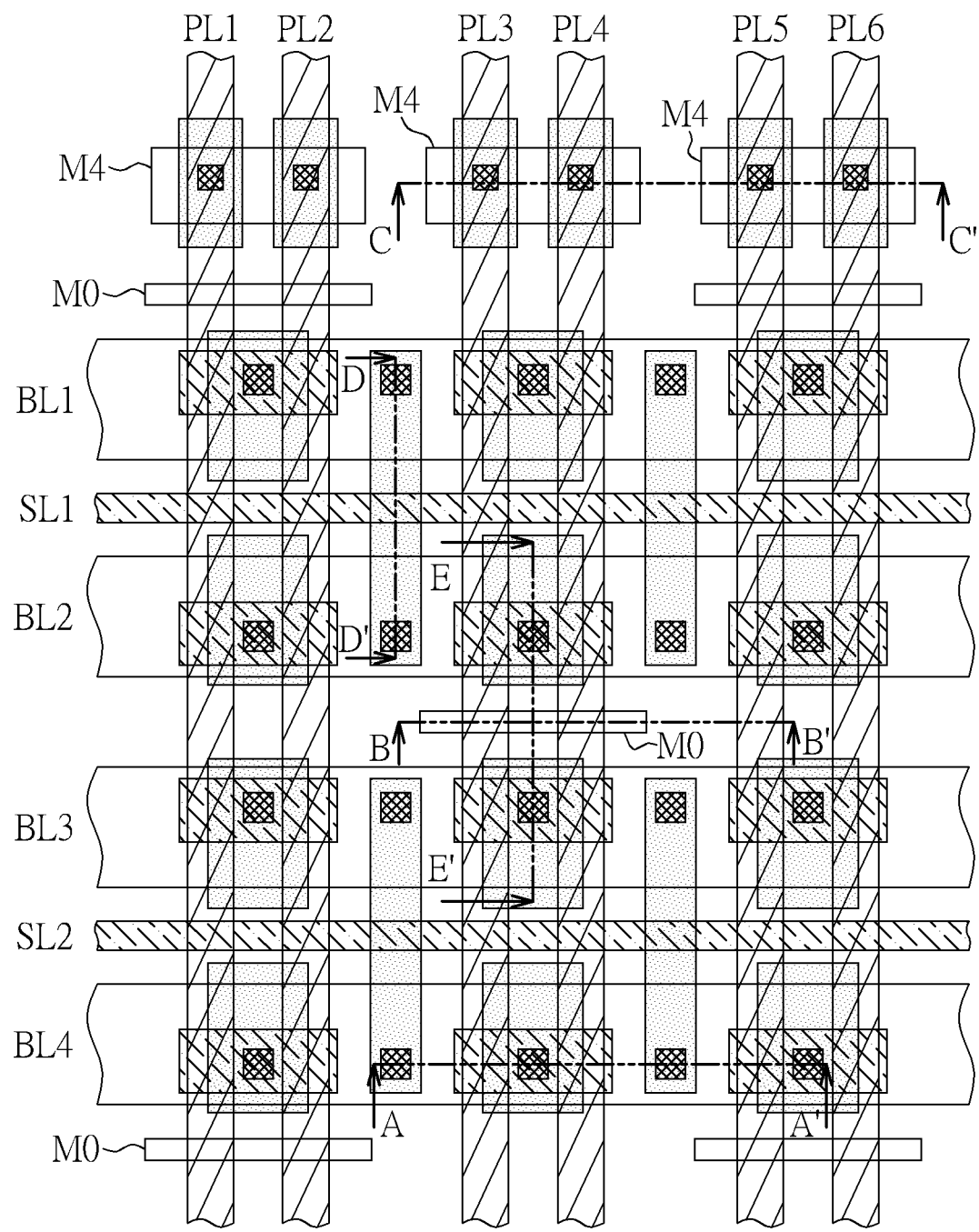
Figure 11:
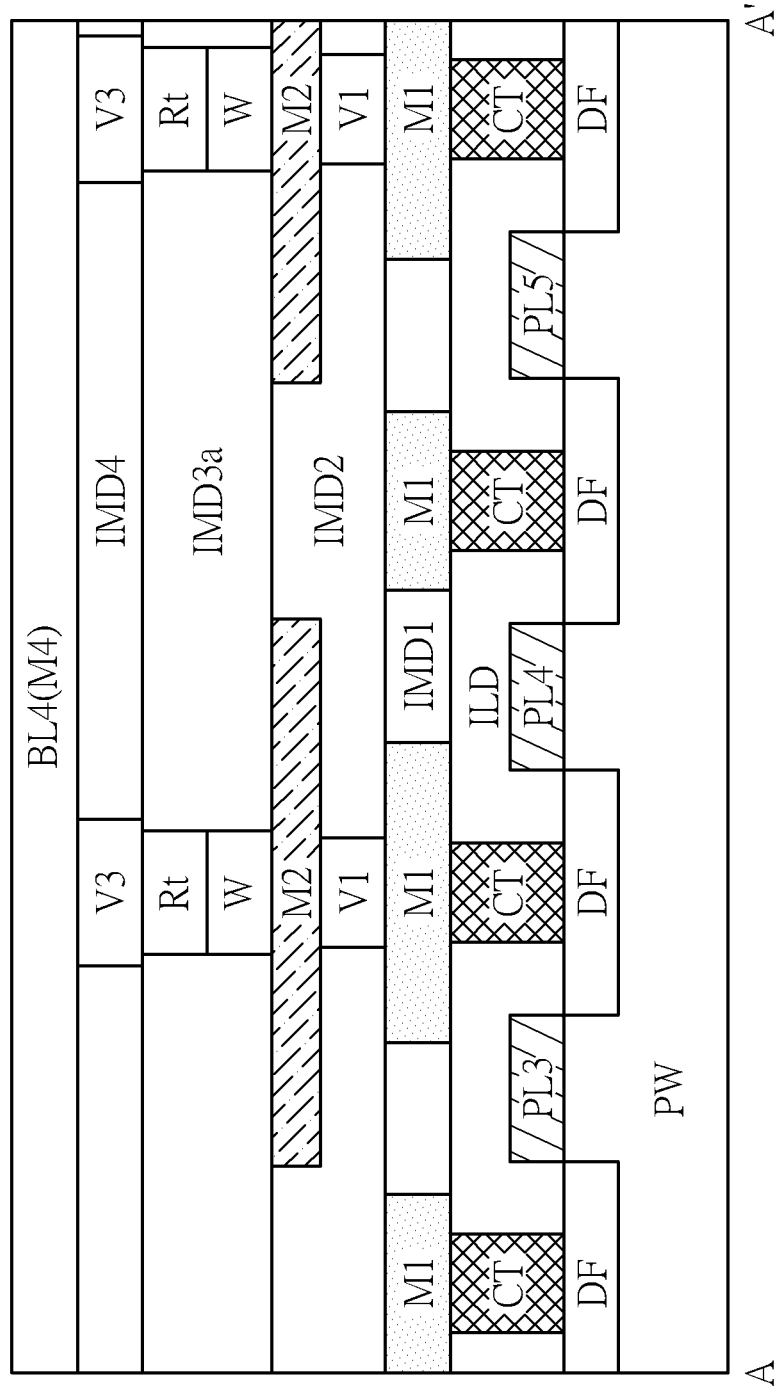
Figure 12:
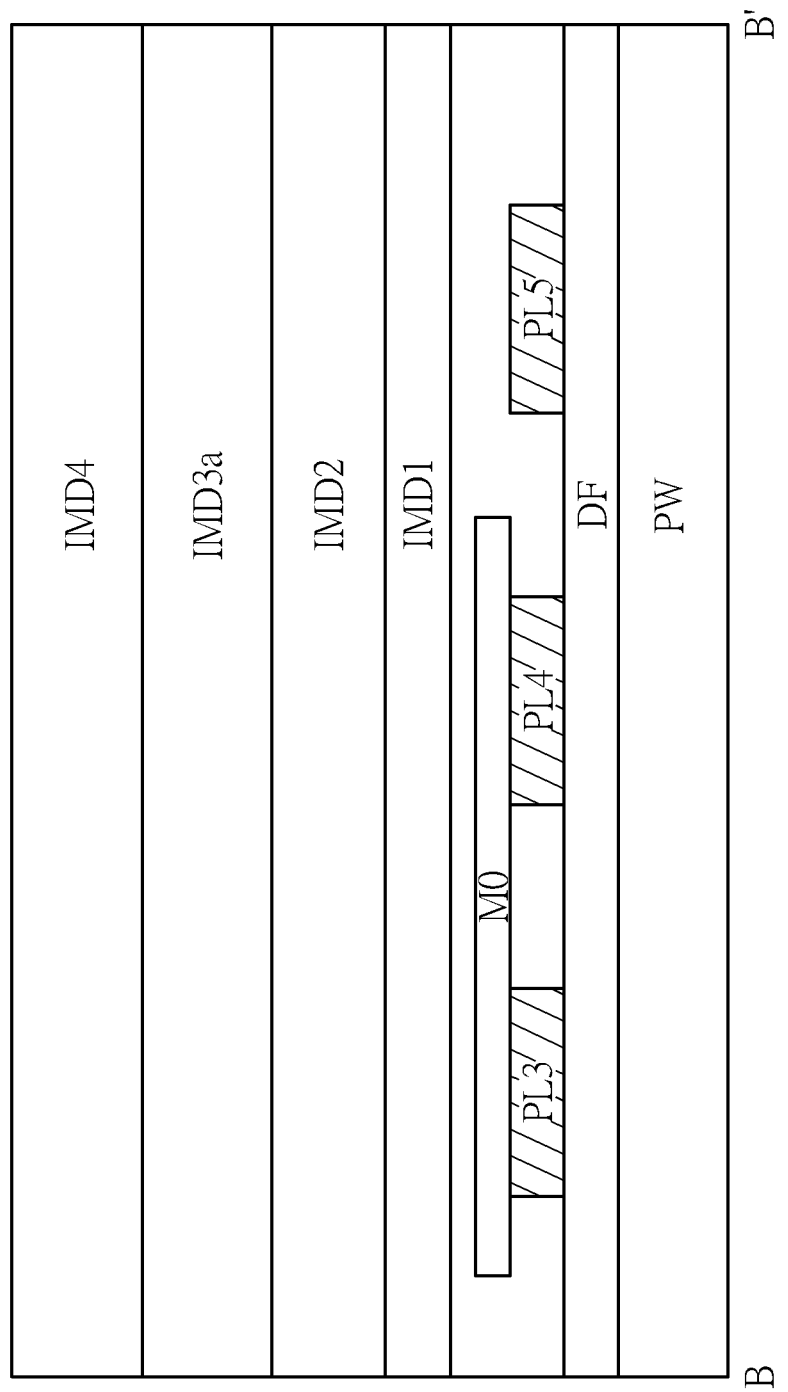
Figure 13:
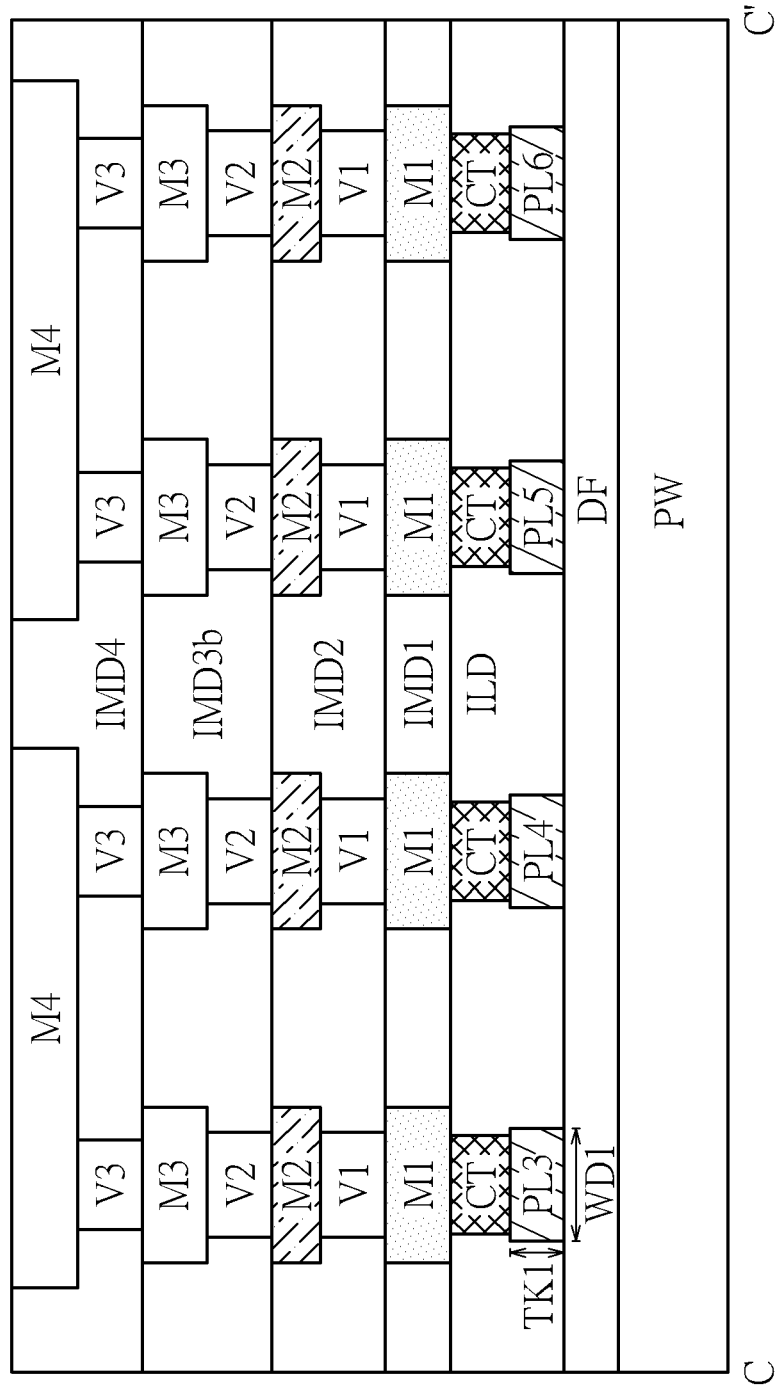
Figure 14:
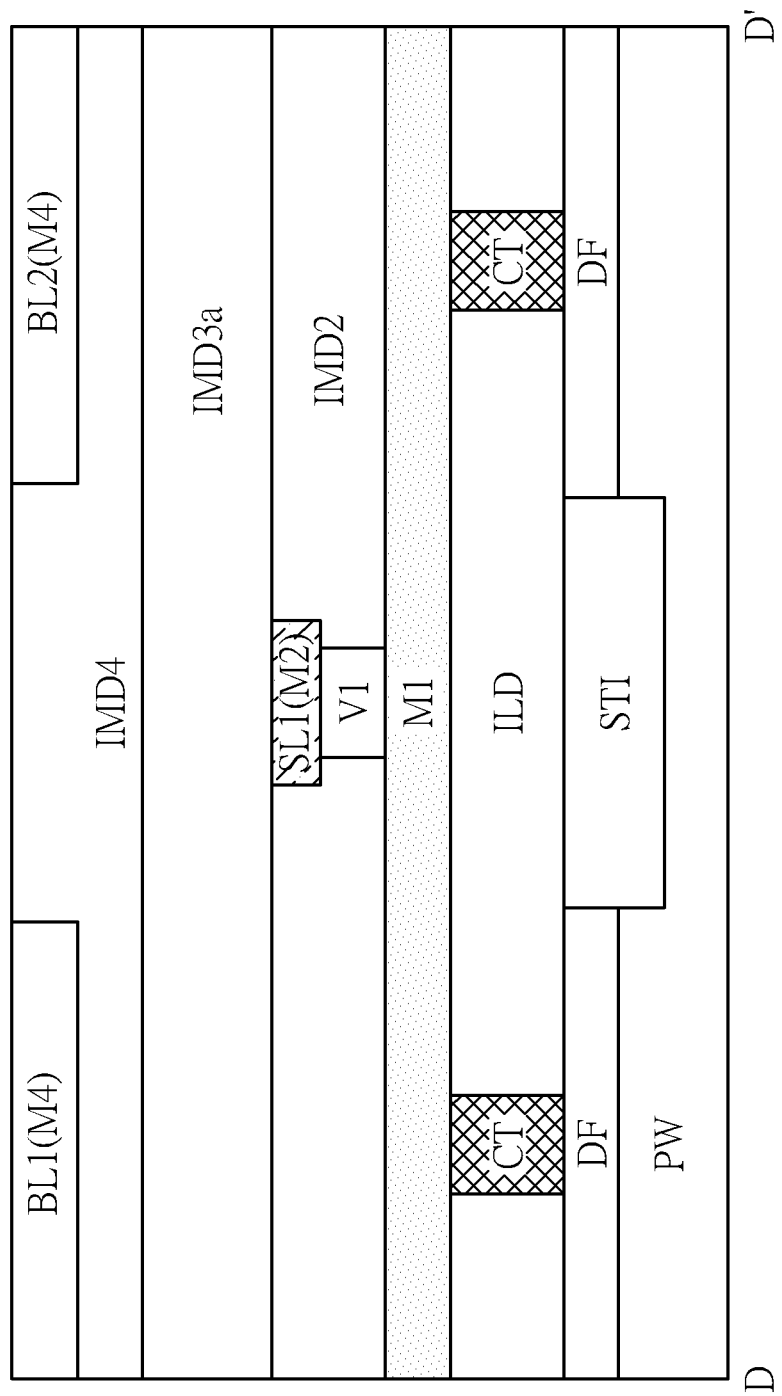
Figure 15:
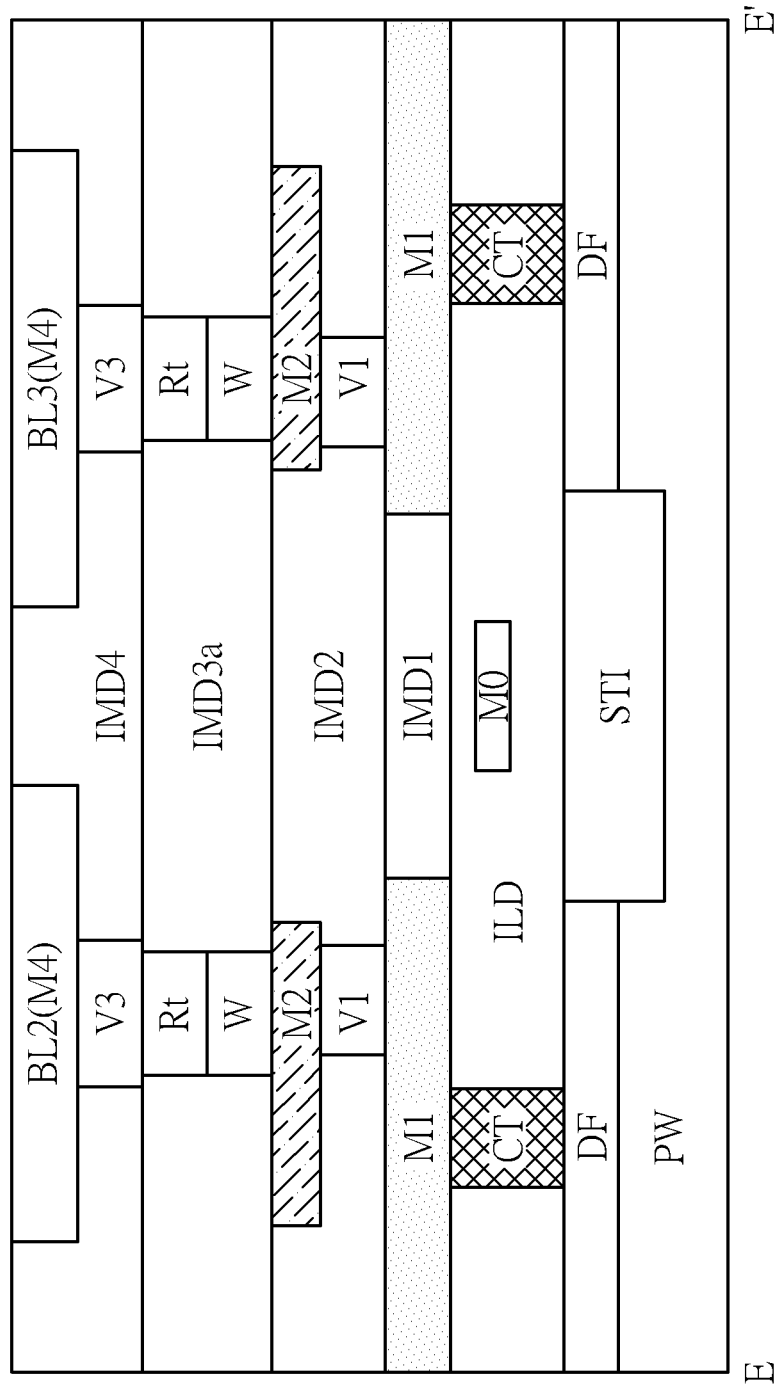
Figure 16:
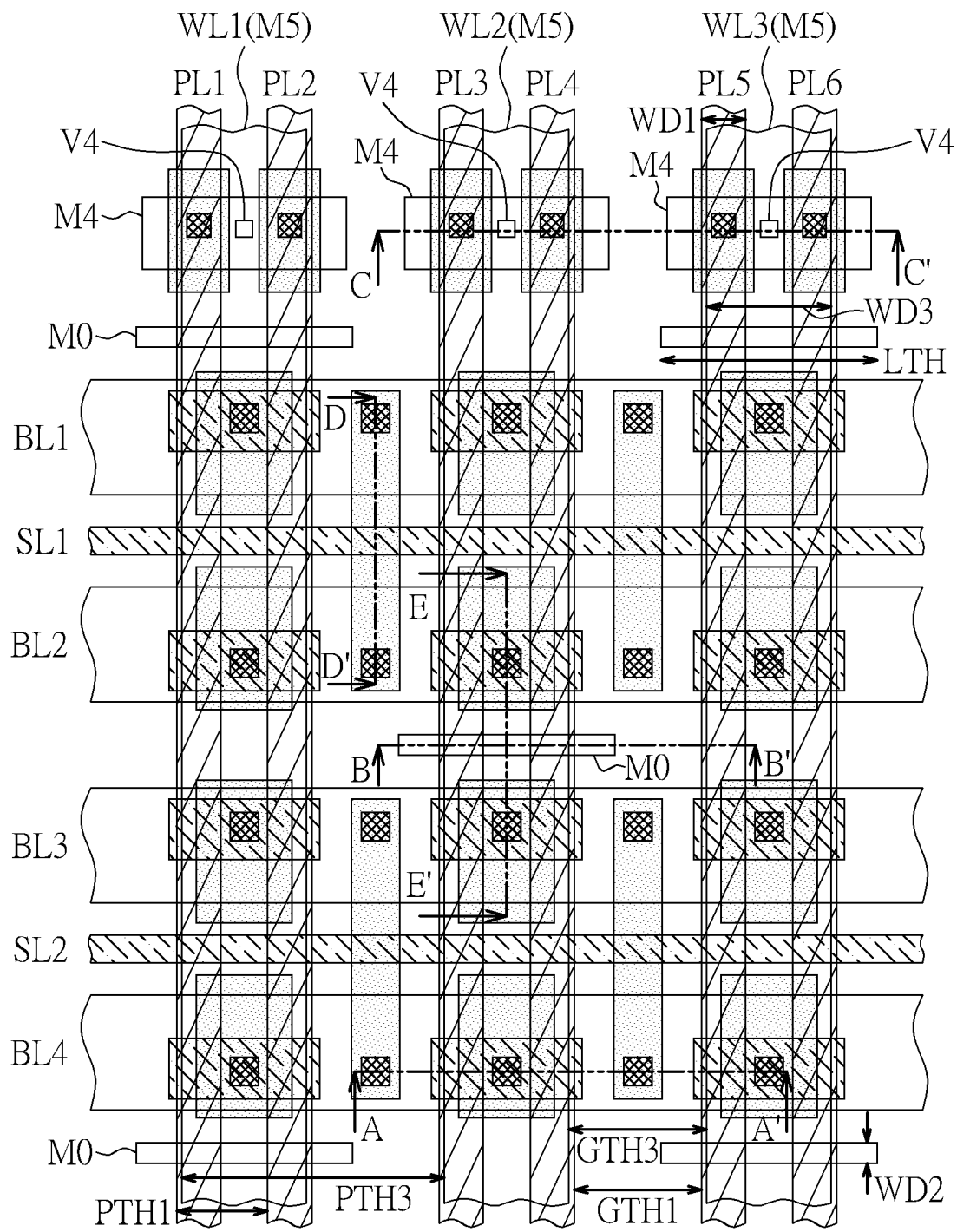
Figure 17:
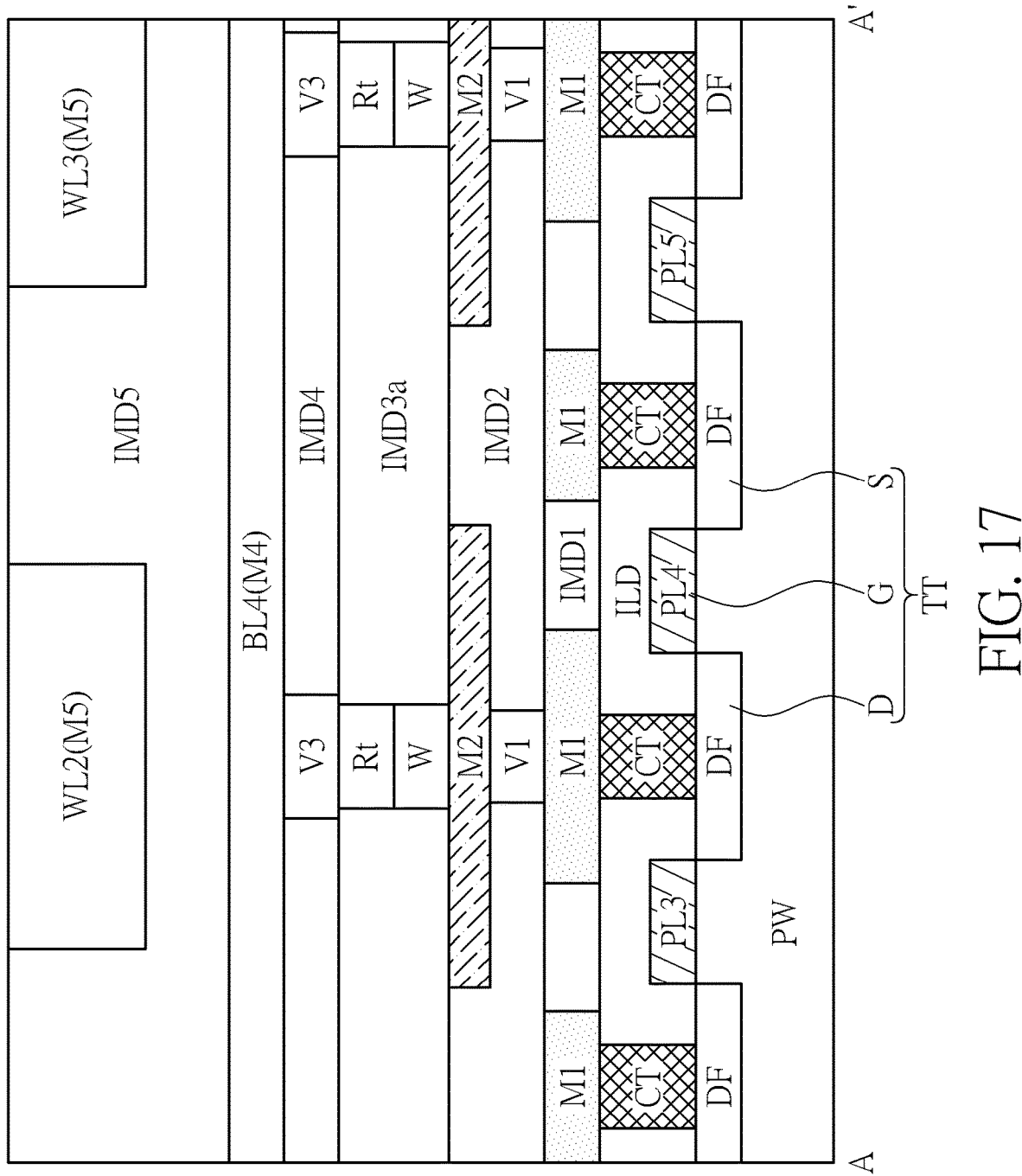
Figure 18:
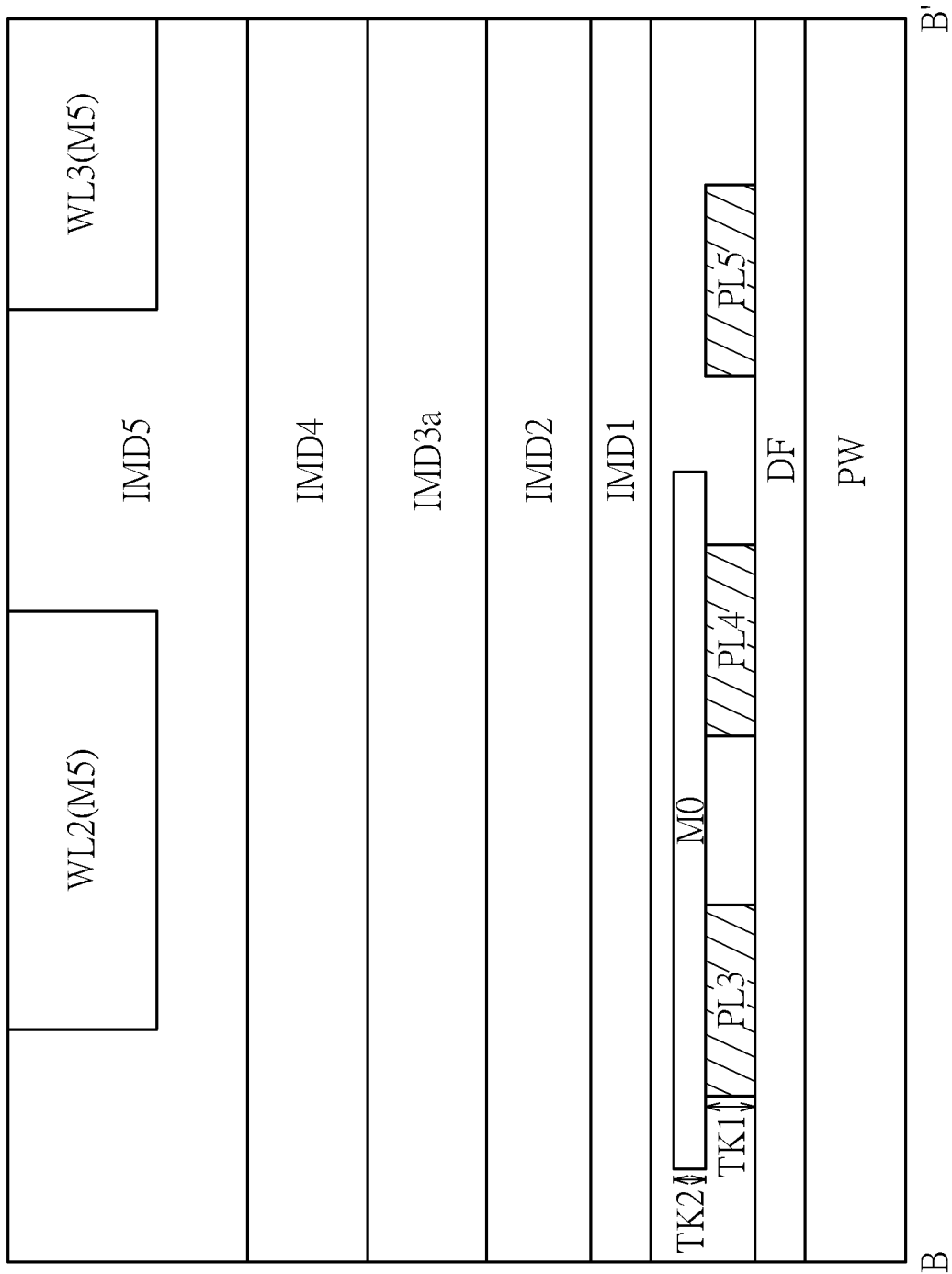
Figure 19:
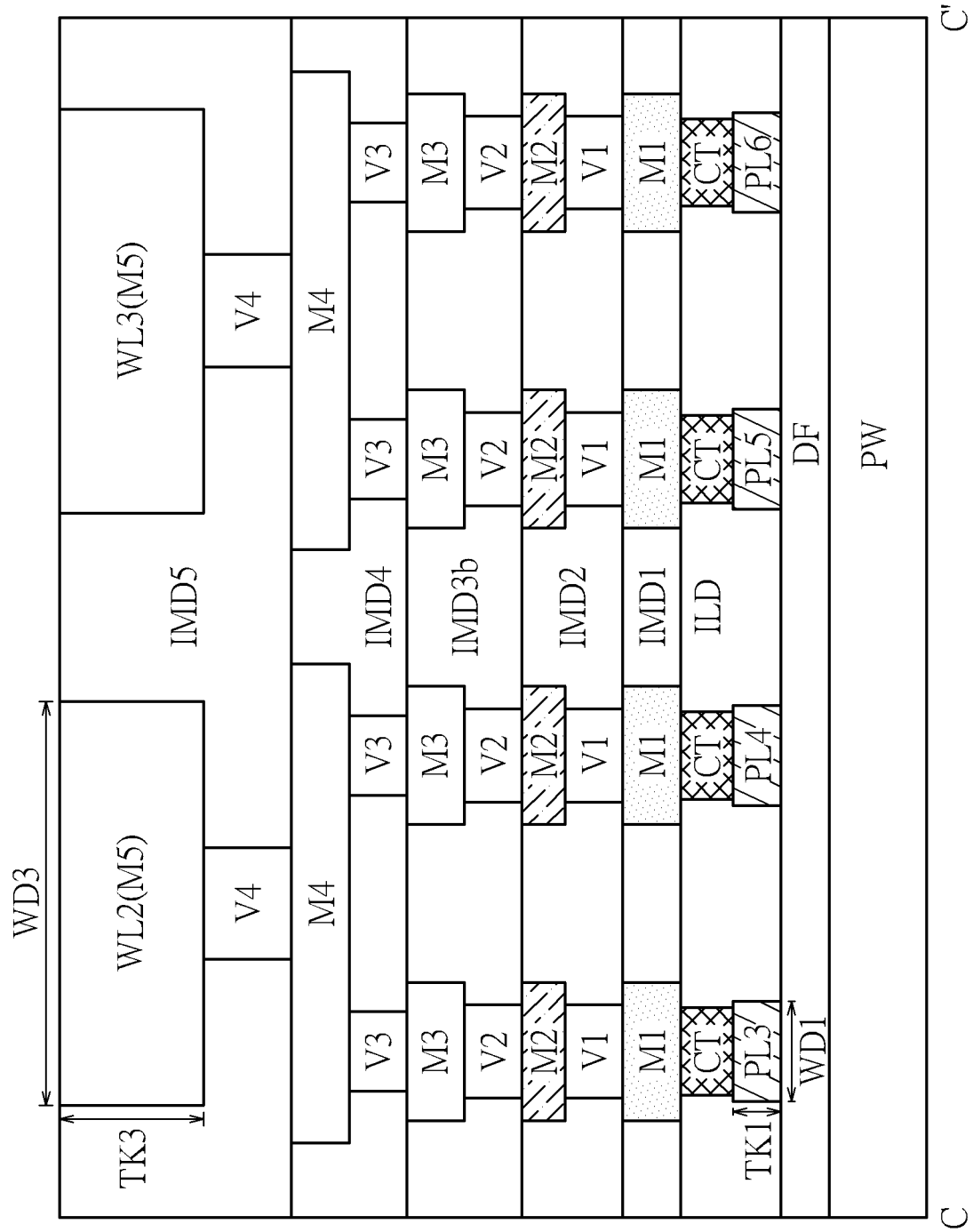
Figure 20:
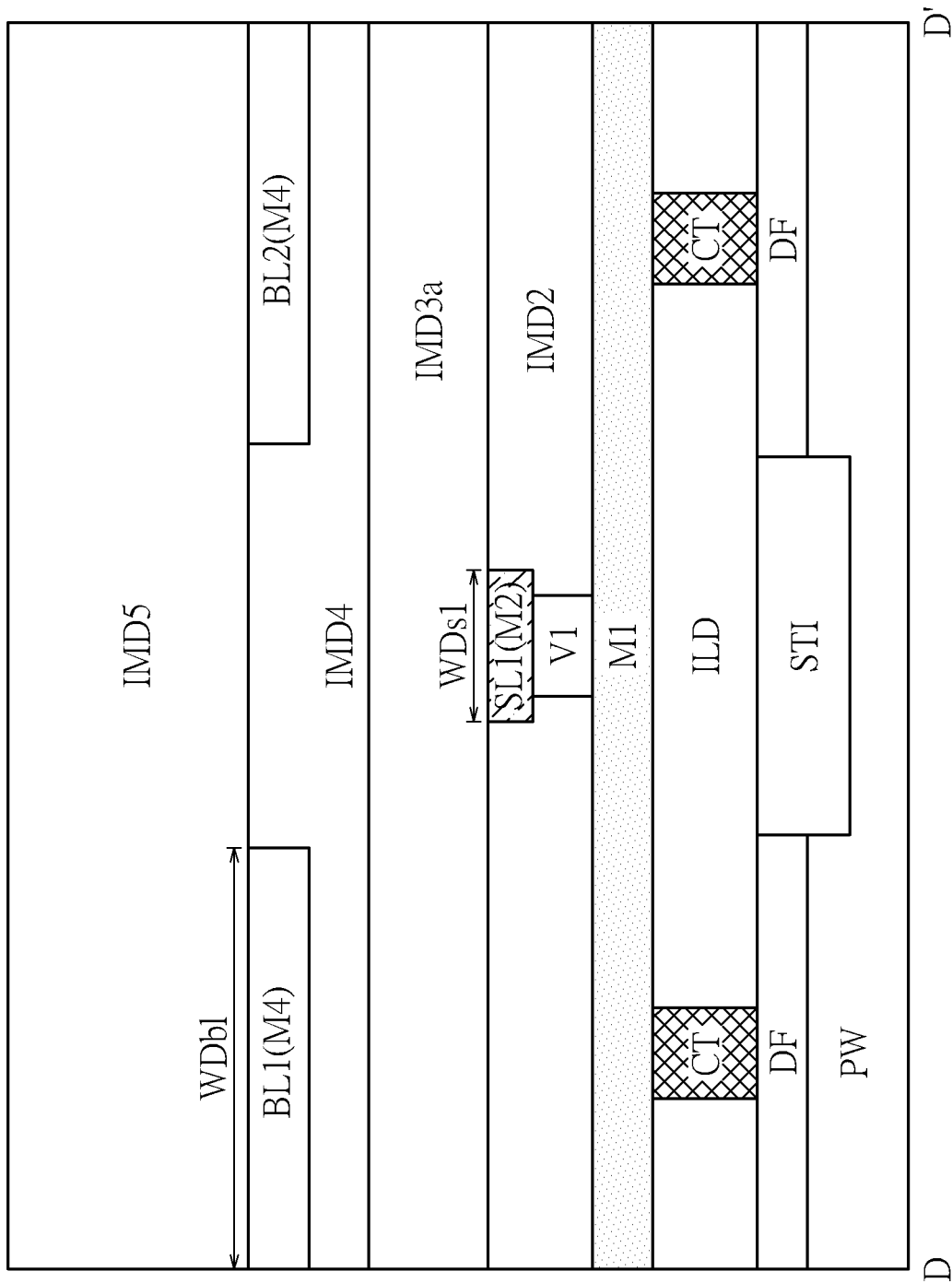
Figure 21:
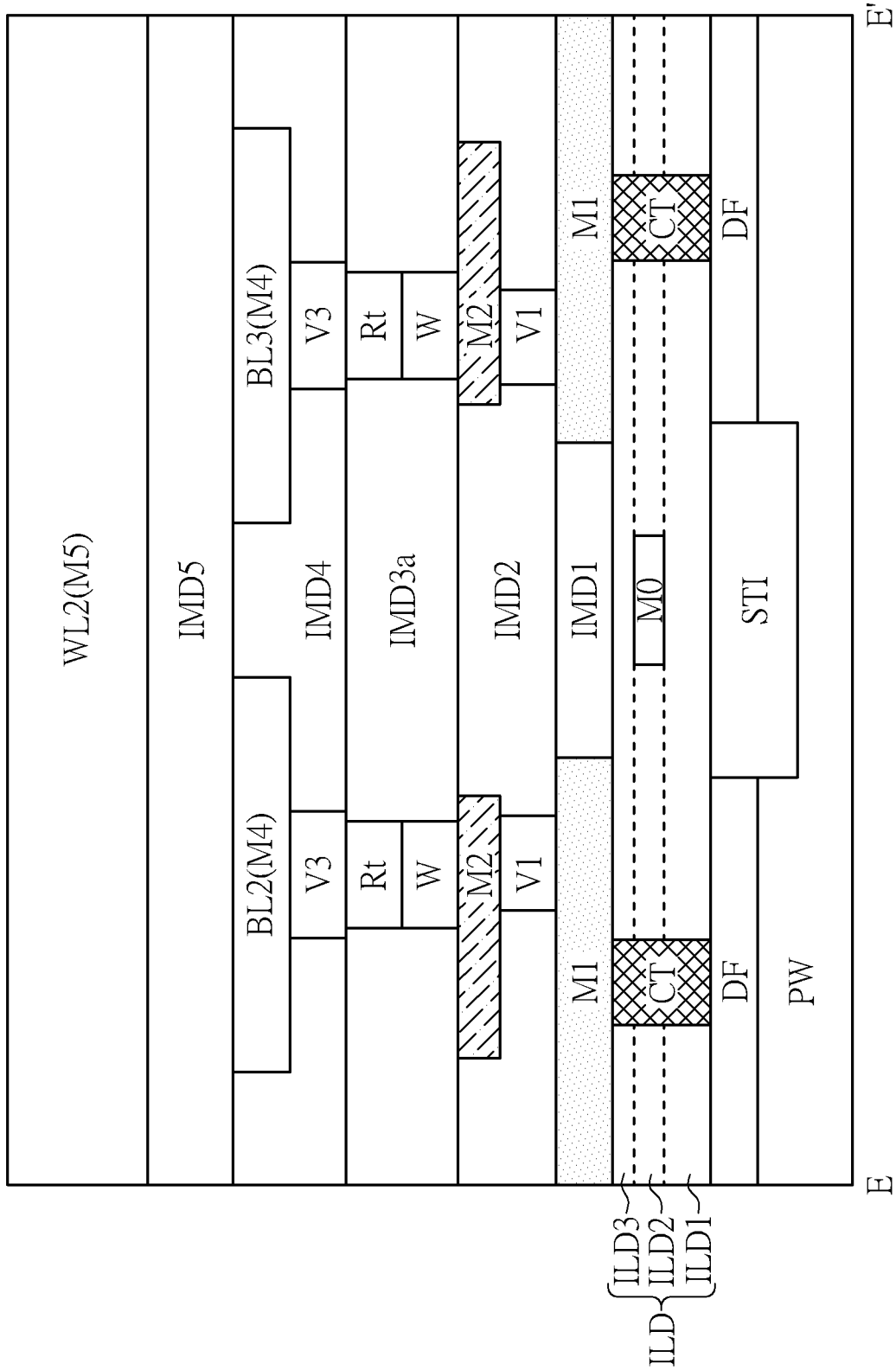

Please refer to FIGS. 4 to 21, which are schematic diagrams illustrating a memory fabrication method according to an embodiment of the present invention. The memory fabrication method may be utilized to fabricate the memory 10 shown in FIG. 1 or the memory 20 shown in FIG. 2. FIGS. 4, 10, and 16 are top-view schematic diagrams. FIGS. 5, 11, and 17 may be regarded as cross-sectional view diagrams taken along a cross-sectional line A-A' in FIGS. 4, 10, and 16. FIGS. 6, 12, and 18 may be regarded as cross-sectional view diagrams taken along a cross-sectional line B-B' in FIGS. 4, 10, and 16. FIGS. 7, 13, and 19 may be regarded as cross-sectional view diagrams taken along a cross-sectional line C-C' in FIGS. 4, 10, and 16. FIGS. 8, 14, and 20 may be regarded as cross-sectional view diagrams taken along a cross-sectional line D-D' in FIGS. 4, 10, and 16. FIGS. 9, 15, and 21 may be regarded as cross-sectional view diagrams taken along a cross-sectional line E-E' in FIGS. 4, 10, and 16.

As shown in FIG. 5, a substrate PW is provided. In some embodiments, the substrate PW may be, for example, a P-type semiconductor substrate or an N-type semiconductor substrate. In some embodiments, the material of the substrate PW may include, for example, silicon, silicon germanium (SiGe), silicon carbide (SiC), gallium arsenide (GaAs), gallium phosphide (GaP), indium phosphide (InP), indium arsenide (InAs), indium antimonide (InSb), other semiconductor materials, compounds or combinations thereof, but is not limited thereto. In some embodiments, the substrate PW may be, for example, a semiconductor on insulator (SOI). In some embodiments, the substrate PW may include doped regions DF such as a p-well or an n-well.

Next, as shown in FIGS. 5 and 17, transistors TT are formed on the substrate PW. Each transistor TT is located in an active area of the substrate PW, and approximately disposed in an inter-layer dielectric ILD. Each transistor TT may include a gate G, a gate insulating layer (not shown), a source S and a drain D. The source S and the drain D are formed in the doped regions DF respectively. As shown in FIG. 17, the drain D is electrically connected to one of the storage structures Rt. There are a contact structure CT, a conductive layer M1, a conductive via V1, a conductive layer M2 and a carrying layer W stacked in spatial sequence/order between the drain D and the storage structure Rt. The storage structure Rt is electrically connected to a conductive layer M4 serving as a bit line (for instance, the bit line BL4) through a conductive via V3. In some embodiments, the storage structure Rt may include a bottom electrode, a fixed layer, an insulating layer, a free layer, or an upper electrode, but is not limited thereto.

As shown in FIGS. 17 and 20, the source S is electrically connected to the conductive layer M1 through the contact structure CT, and is electrically connected to the conductive layer M2 serving as the source line (for instance, the source line SL1) through the conductive layer M1. As shown in FIG. 20, the conductive layer M2 serving as a source line (for instance, the source line SL1) and the conductive layer M4 serving as the bit line (for instance, the bit line BL2 or BL3) are located in different layers, such that the source line (for instance, source line SL1) and the bit line (for instance, the bit line BL2 or BL3) are electrically isolated from each other. In some embodiments, a width WDsl of one of the source lines (for instance, the source line SL1) and a width WDbl of one of the bit lines (for instance, the bit line BL2 or BL3) may be adjusted according to different requirements. For example, the widths WDsl and WDbl may be increased so that the source line (for instance, the source line SL1) overlaps the bit line (for instance, the bit line BL2 or BL3).

The gate G is utilized to form a gate electrode line (for instance, the gate electrode line PL4). In some embodiments, the material of the gate G may include, for example, polysilicon or metal, but is not limited thereto. In some embodiments, sidewalls of the gate G may be covered by spacer(s). As shown in FIG. 19, the gate electrode line(s) (for instance, the gate electrode line PL3 or PL4) formed by the gate(s) G is/are electrically connected to one of the conductive lines M5 serving as a word line (for instance, the word line WL2). There are the contact structure CT, the conductive layer M1, the conductive via V1, the conductive layer M2, a conductive via V2, a conductive layer M3, a conductive via V3, the conductive layer M4, and a conductive via V4 stacked in spatial sequence/order between the gate electrode line (for instance, the gate electrode line PL3 or PL4) and the conductive line M5. As set forth above, there may be a plurality of layers (namely, the contact structure CT, the conductive layer M1, the conductive via V1, the conductive layer M2, the conductive via V2, the conductive layer M3, the conductive via V3, the conductive layer M4, and the conductive via V4) disposed between the gate G of the transistor TT and the conductive line M5 serving as a word line (for instance, the word line WL2). These layers may make the electric potential of one of the gates G or its corresponding gate electrode line different from that of another of the gates G or its corresponding gate electrode line. As shown in FIGS. 18 and 19, the conductive line M0 contacts and is directly connected between/to the gate electrode lines (for instance, the gate electrode lines PL3 and PL4). Accordingly, the electric potential of the gate G corresponding to the gate electrode line PL3 may equal the electric potential of the gate G corresponding to the gate electrode line PL4. In addition, the conductive line M0 may be utilized to further prevent signal transmission abnormalities (for instance, the voltage of the gate G located on the gate electrode line PL3 does not change according to that of the word line WL2) caused by manufacture process defects within the gate electrode line(s) (for instance, the gate electrode line PL3 or PL4 is broken/fractured or even fragmented into several pieces) or within wiring trace(s) (for instance, the conductive via V1 or the conductive layer M2 is broken/fractured) connected to the word line voltage input terminal(s) Pnt. Even if certain gate electrode line(s) or wiring trace(s) connected to the word line voltage input terminal(s) Pnt is broken/fractured to form an open circuit, the gate G may be connected to another word line voltage input terminal Pnt through the network formed by the conductive lines M0 to receive word line voltage (for instance, from the control circuit).

In some embodiments, the conductive lines M0 are located in a layer different from the layer in which the gate electrode lines PL1 to PL2m are located; alternatively, the conductive line M0 and the gate electrode line (for instance, the gate electrode lines PL1 to PL2m) are formed from different unpatterned material layers by different manufacture processes respectively. In some embodiments, the conductive line M0 is located in the same layer as the gate electrode lines PL1 to PL2m; alternatively, the conductive lines M0 and the gate electrode lines PL1 to PL2m are made from the same unpatterned material layer in the same manufacture process/processes. In some embodiments, a first thickness TK1 of one of the gate electrode lines PL1 to PL2m is 0.5 to 2 times as large as a second thickness TK2 of one of the conductive lines M0. In some embodiments, the conductive lines M0 may have different thicknesses, and the gate electrode lines PL1 to PL2m may have different thicknesses.

As shown in FIG. 19, each of the conductive lines M5 is electrically connected to at least one of the gate electrode lines PL1 to PL2m, and there is no other conductive layer arranged between two adjacent ones of the conductive lines M5. As shown in FIG. 19, the cross-sectional area (or thickness, or width) of one of the conductive lines M5 serving as a word line (for instance, the word line WL2 or WL3) may be appropriately increased to reduce the resistance of the conductive line M5. The increased cross-sectional area (or thickness, or width) may reduce loads of the conductive line M5, such that the voltage drop along the conductive line M5 is lower to moderate power consumption. In some embodiments, the first thickness TK1 of one of the gate electrode lines (for instance, the gate electrode line PL3) is 0.1 to 0.5 as large as a second thickness TK3 of one of the conductive lines M5, but is not limited thereto. In some embodiments, the first width WD1 of one of the gate electrode lines (for instance, the gate electrode line PL3) is smaller than the second width WD3 of one of the conductive lines M5, but is not limited thereto. In some embodiments, the conductive lines M5 may have different thicknesses or widths. As shown in FIG. 17, the conductive line M5 serving as a word line (for instance, the word line WL2) and the conductive layer M4 serving as a bit line (for instance, the bit line BL4) are located in different layers, such that the word line (for instance, the word line WL2) and the bit line (for instance, the bit lines BL4) are electrically isolated from each other.

As shown in FIGS. 17 to 21, there are inter-metallic dielectric layers IMD1, IMD2, IMD3a, IMD3b, IMD4, and IMD5 stacked on the dielectric layer ILD. The conductive layer M1 is located in the dielectric layer IMD1. The conductive layer M2 and the conductive via V1 are located in the same layer (namely, the dielectric layer IMD2). The carrying layer W and the storage structure Rt are located in the same layer (namely, the dielectric layer IMD3a). The conductive layer M3 and the conductive via V2 are located in the same layer (namely, the dielectric layer IMD3b). The conductive layer M4 and the conductive via V3 are located in the same layer (namely, the dielectric layer IMD4). The conductive line M5 and the conductive via V4 are located in the same layer (namely, the dielectric layer IMD5). As shown in FIG. 21, the dielectric layer ILD may have a multilayer stacked structure, and the conductive line M0 is located in the multilayer stacked structure of the dielectric layer ILD. For example, the conductive line M0 is located in the dielectric layer ILD2 and thus sandwiched between the dielectric layers ILD1 and ILD3. As shown in FIG. 21, the conductive lines M0 and the contact structures CT are both located in the dielectric layer ILD; however, the conductive lines M0 and the contact structures CT are spaced (far) apart by a distance and hence electrically isolated. Similarly, the conductive line M0 and the conductive layer M1 are located in different layers. The conductive line M0 and the conductive layer M1 are spaced (far) apart by a distance and hence electrically isolated. For example, as shown in FIG. 21, the conductive line M0 is separated from the conductive layer M1 by a distance, and they are electrically isolated by the dielectric layer ILD3. As shown in FIG. 16, the conductive line M0 does not overlap the contact structure CT, the metal layer M1, or the source line (for instance, the source line SL1 or SL2). Since the conductive line M0 does not overlap the conductive layer M1, coupling capacitors may be eliminated. In order to further prevent the conductive line M0 from overlapping the conductive layer M1, the conductive line M0 does not overlap any of the bit lines BL1 to BL2$n$, nor is it disposed in/within any of the data storage cells DSC.

As shown in FIG. 21, the center of one of the conductive lines M0 is aligned with the geometric center of a shallow trench isolation layer STI. As shown in FIGS. 19 and 20, the contact structures CT are respectively disposed on the doped regions DF or the gate electrode lines PL1 to PL2$m$. The shallow trench isolation layer STI is formed in the substrate PW and is located between the doped regions DF. The shallow trench isolation layer STI is used to define and electrically isolate adjacent ones of the transistors TT. In some embodiments, the material of the shallow trench insulation layer STI may have a high dielectric constant or be a high kappa (high-K) dielectric, which is a material with higher dielectric constant than that of silicon dioxide ($SiO_2$), wherein K may be greater than or equal to 8. In some embodiments, the material of the shallow trench isolation layer STI may have a low dielectric constant or be a low-K dielectric, and K may be less than or equal to 4. In some embodiments, the material of the shallow trench isolation layer STI may include, for example, oxide (for instance, germanium (Ge) oxide, titanium oxide ($Ti_xO_y$), tantalum oxide ($Ta_xO_y$), or $SiO_2$), oxynitride (for instance, gallium phosphide (GaP) oxynitride or silicon oxynitride ($Si_xO_yN_z$)), barium strontium titanate (BST, $BaTiO_3$/$SrTiO_3$), or other dielectric materials, but is not limited thereto.

In some embodiments, the materials of the contact structures CT, the conductive layers M1, M2, M3, M4, the conductive vias V1, V2, V3, and the conductive lines M0, M5 may include, for example, copper, aluminum copper, aluminum, gold, other metals, or alloys thereof, but is not limited thereto. In some embodiments, the material of the contact structures CT may include, for example, nickel silicide (NiSi), nickel-platinum silicide (NiPtSi), nickel-platinum-germanium silicide, NiPtGeSi), nickel-germanium silicide (NiGeSi), erbium silicide (ErSi), cobalt silicide (CoSi), ytterbium silicide (YbSi), platinum silicide (PtSi), iridium silicide (IrSi), other silicides, or other conductive materials, but is not limited thereto. In some embodiments, the material of the conductive layers M1 to M4 may include, for example, single polysilicon (poly), but is not limited thereto. In some embodiments, the contact structures CT, the conductive layers M1 to M4, the conductive vias V1 to V3, and the conductive lines M0, M5 may be formed by a single damascene operation, a dual damascene operation, and electroplating, low-pressure chemical vapor deposition (LPCVD), plasma-enhanced chemical vapor deposition (PECVD), sputtering, evaporation, high-density inductively coupled plasma (ICP) deposition, high-density ionized metal plasma (IMP) deposition, other chemical or physical vapor deposition, but is not limited thereto. In some embodiments, the carrying layer W may be formed by the material(s) or manufacture process/processes for the conductive vias V1 to V3, but is not limited thereto.

In some embodiments, the material of the dielectric layer ILD may include, for example, oxide (for instance, Ge oxide, $Ti_xO_y$, $Ta_xO_y$, or $SiO_2$), oxynitride (for instance, GaP oxynitride or $Si_xO_yN_z$), BST), or other dielectric materials, but is not limited thereto. In some embodiments, the dielectric layer ILD may be formed by chemical vapor deposition (CVD) such as LPCVD or PECVD, or physical vapor deposition (PVD) such as sputtering or evaporation, but is not limited thereto. In some embodiments, the materials of the dielectric layers IMD1, IMD2, IMD3$a$, IMD3$b$, IMD4, IMD5 may have a low dielectric constant or be a low-K dielectric, and K may be less than or equal to 3.8. In some embodiments, the materials of the dielectric layers IMD1 to IMD5 may include dielectric materials such as silicate glass (USG), fluorinated silicate glass (FSG), but is not limited thereto. In some embodiments, the memory fabrication method may appropriately adopt planarization process/processes such as a chemical-mechanical planarization (CMP) operation.

Figure 22:
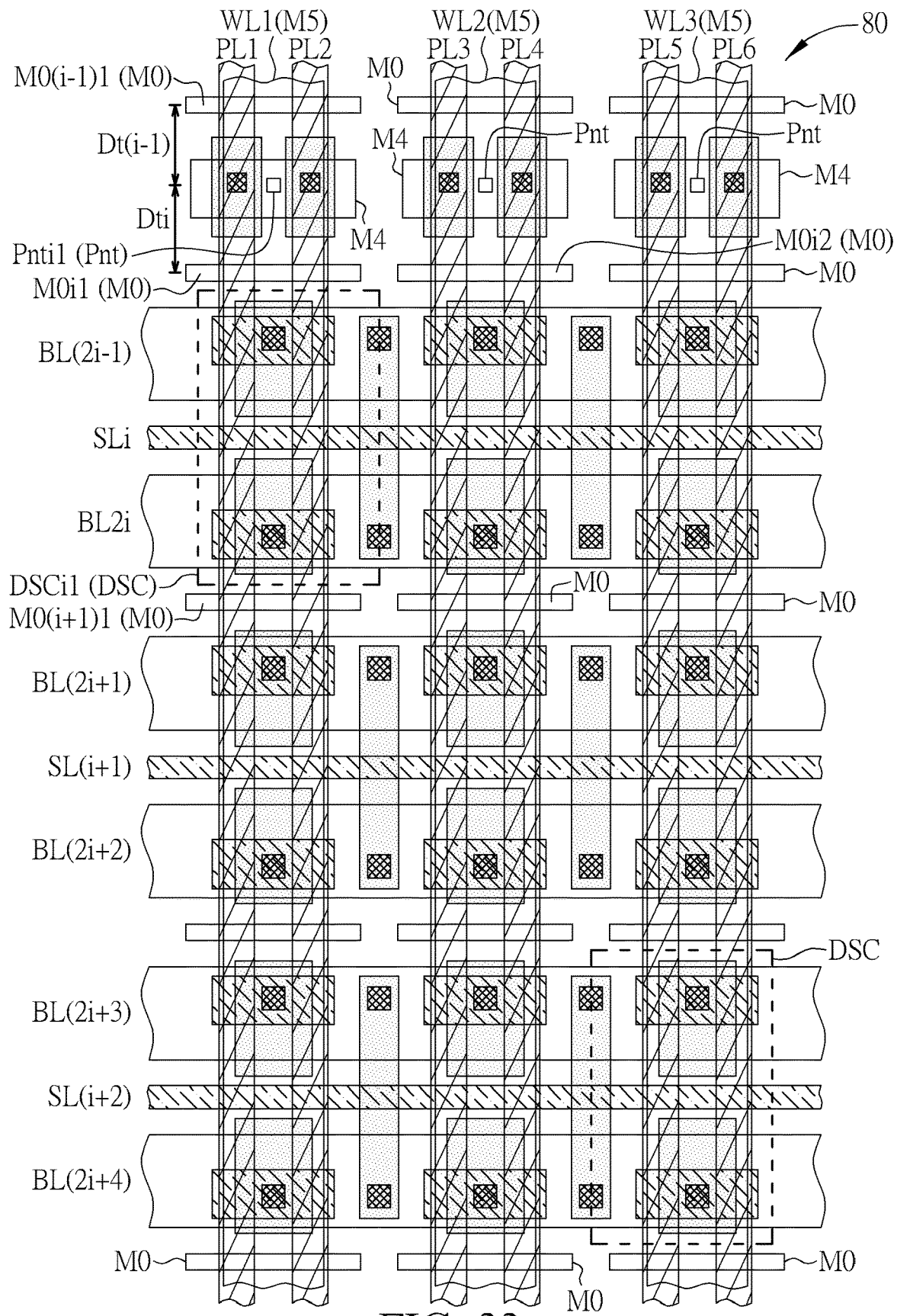
FIG. 22 and FIG. 23 are schematic diagrams of part of a memory according to an embodiment of the present invention respectively.

The memory 10 shown in FIG. 1 or the memory 20 shown in FIG. 2 is an exemplary embodiment of the present invention, and those skilled in the art may readily make different substitutions and modifications. For example, please refer to FIG. 22, which is a schematic diagram of part of a memory 80 according to an embodiment of the present invention. The structure of the memory 80 shown in FIG. 22 is similar to that of the memory 20 shown in FIG. 2, and hence the same numerals and notations denote the same components in the following description. Unlike the memory 20 shown in FIG. 2, the number of the conductive lines M0 of the memory 80 shown in FIG. 22 is larger. The conductive lines M0 are more densely arranged in the memory 80, which requires more delicate patterning. In some embodiments, the conductive lines M0 coupled to the gate electrode lines of the neighboring sets are aligned with each other instead of being staggered. For example, the conductive line M0$i$1 is coupled to the gate electrode lines PL1 and PL2 in one set, and the conductive line M0$i$2 is coupled to the gate electrode lines PL3 and PL4 in another adjacent set. The conductive lines M0$i$1 and M0$i$2 are aligned and do not stagger. In some embodiments, two of the conductive lines M0, which are adjacent to the opposite sides of one of the source lines SL1 to SLn respectively, are aligned with each other but not staggered. For example, the conductive lines M0$i$1 and M0($i$+1)1 are adjacent to the two sides of the source lines SL$i$ respectively and are aligned without being staggered. In some embodiments, one of the conductive lines M0, which overlaps one conductive line M5, is non-staggered and aligned with another of the conductive lines M0, which overlaps another conductive line M5. For example, the conductive line M0$i$1 overlapping the word line WL1 do not stagger but is aligned with the conductive line M0$i$2 overlapping the word line WL2.

In some embodiments, the conductive lines M0 are electrically isolated from each other and not coupled to each other. For example, the conductive line M0$i$1 is electrically isolated from the conductive line M0$i$2 without being coupled to the conductive line M0$i$2. In some embodiments, two adjacent ones of the conductive lines M0 in the same column may be separated by one (or more) of the data storage cells DSC in the same column. For example, the conductive lines M0i1 and M0(i+1)1, which are adjacent to each other and located in the same column, may be separated by the data storage cell DSCi1. Alternatively, the conductive lines M0i1 and M0(i+1)1, which are adjacent to each other and located in the same column, may be separated by more than one of the data storage cells DSC. In some embodiments, at least two adjacent ones of the bit lines BL1 to BL2n are located between two adjacent and aligned ones of the conductive lines M0. For example, the bit lines BL(2i−1) and BL2i are located between the conductive lines M0i1 and M0(i+1)1, which are adjacent to and aligned with each other. Alternatively, more than two of the bit lines BL1 to BL2n are located between the conductive lines M0i1 and M0(i+1)1, which are adjacent to and aligned with each other. In some embodiments, one of the word line voltage input terminals Pnt is separated from the neighboring conductive lines M0 on both sides by the same distance. For example, there is a distance Dt(i−1) between the word line voltage input terminal Pnti1 and the conductive line M0(i−1) adjacent to one side of the word line voltage input terminal Pnti1. There is a distance Dti between the word line voltage input terminal Pnti1 and the conductive line M0i1 adjacent to the opposite side of the word line voltage input terminal Pnti1. The distances Dt(i−1) and Dti are equal. In some embodiments, none of the data storage cells DSC is disposed between one of the word line voltage input terminals Pnt and the conductive line M0 (for instance, the conductive line M0(i−1) or M0i1) adjacent to either side of the word line voltage input terminal Pnt (for instance, the word line voltage input terminal Pnti1).

Figure 23:
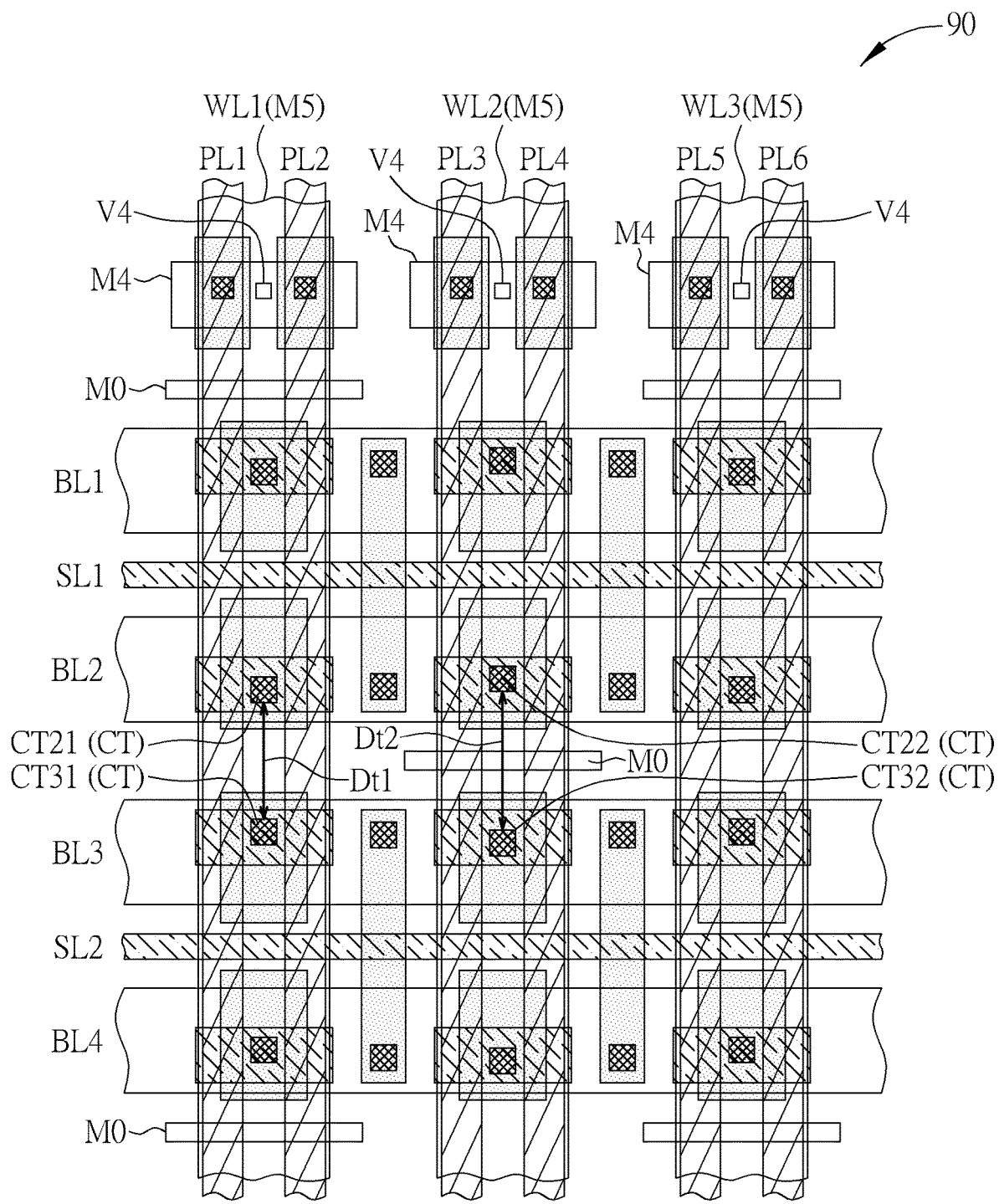

Please refer to FIG. 23, which is a schematic diagram of part of a memory 90 according to an embodiment of the present invention. The structure of the memory 90 shown in FIG. 23 is similar to that of the memory 20 shown in FIG. 2, and hence the same numerals and notations denote the same components in the following description. Unlike the memory 20 shown in FIG. 2, the distribution of the contact structures CT of the memory 90 shown in FIG. 23 may be adaptively adjusted because of the conductive lines M0. As shown in FIG. 23, the contact structures CT along one row of the array are not perfectly aligned with each other. When there is one of the conductive lines M0 disposed between two adjacent ones of the contact structures CT, the two neighboring contact structures CT are separated by a distance Dt2. For example, there is the distance Dt2 between the contact structures CT22 and CT32 adjacent to each other. When there is no conductive line M0 arranged between two adjacent ones of the contact structures CT, the two adjacent contact structures CT are separated by a distance Dt1. For example, there is the distance Dt1 between the contact structures CT21 and CT31 adjacent to each other. The distance Dt2 is greater than the distance Dt1. In this way, the conductive line M0 is spaced (far) apart from the contact structure CT by a sufficient distance to ensure electrically isolation between the conductive lines M0 and the contact structures CT.

Besides, each of the conductive lines M5 may completely overlap two of the gate electrode lines PL1 to PL2m. For example, one of the conductive lines M5 may entirely overlap and completely cover the gate electrode lines PL1 and PL2 adjacent to the conductive line M5. Distinct from the memory 20 shown in FIG. 2, the conductive line M5 does not expose, for example, the left side of the gate electrode line PL1 or the right side of the gate electrode line PL2. Therefore, each of the conductive lines M5 completely overlaps two of the gate electrode lines PL1 to PL2m.

In summary, the present invention optimizes the layout design of word lines. The present invention reduces the resistance of each of the word lines by increasing the cross-sectional area of each of the word lines, thereby reducing line loading. In addition, each of the conductive lines is directly connected to the corresponding ones of the gate electrode lines in the present invention. In this way, even if there are a plurality of layers disposed between the gate of one of the transistors and one of the word lines, the electric potential of one gate may equal the electric potential of another gate. Moreover, signal transmission abnormalities caused by manufacture process defects of the gate electrode lines may be averted in the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A data storage cell, comprising:
 a storage structure, wherein a first end of the storage structure is electrically connected to a bit line;
 a first transistor, comprising a first gate, a first drain, and a first source;
 a second transistor, comprising a second gate, a second drain, and a second source, wherein the first gate is electrically connected to the second gate, a second end of the storage structure is electrically connected to the first drain and the second drain, and the first source and the second source are electrically connected to a source line;
 a first resistor, wherein a first end of the first resistor is electrically connected to the first gate and the second gate; and
 a second resistor, wherein a first end of the second resistor is electrically connected to the first gate and the second gate, and a second end of the first resistor and a second end of the second resistor are electrically connected to a word line voltage input terminal through a conductive line.
2. The data storage cell of claim 1, wherein the first gate is electrically connected to the second gate through a first conductive line.
3. The data storage cell of claim 1, wherein an electric potential of the first gate is substantially equal to an electric potential of the second gate, a first potential difference between the first gate and the word line voltage input terminal is equal to a second potential difference between the second gate and the word line voltage input terminal.
4. The data storage cell of claim 1, wherein the first gate and the second gate are coupled to a same word line.
5. The data storage cell of claim 1, wherein the storage structure is a variable resistor to define internal data states, and a resistance of the storage structure is changed according to an applied voltage or an applied current.
6. The data storage cell of claim 1, wherein a resistance of the conductive line is in a range of 10 ohms to 1280 ohms.
7. A memory, comprising:
 a plurality of data storage cells, arranged in an array, wherein a plurality of gates of the plurality of data storage cells respectively constitute a plurality of gate electrode lines;
 a plurality of first conductive lines, wherein each of the plurality of first conductive lines is coupled to two of the plurality of gate electrode lines, and each of the plurality of first conductive lines at least partially overlaps the two gate electrode lines of the plurality of gate electrode lines;

a plurality of source lines, wherein the plurality of source lines are parallel to the plurality of first conductive lines, and two of the plurality of first conductive lines respectively adjacent to opposite sides of one of the plurality of source lines are staggered and non-aligned; and a plurality of second conductive lines, wherein a second pitch between two adjacent ones of the plurality of second conductive lines is more than or equal to twice a first pitch between two adjacent ones of the plurality of gate electrode lines, and a gap width between two adjacent ones of the plurality of gate electrode lines is less than or equal to a width of each of the plurality of second conductive lines.

8. The memory of claim 7, further comprising:

a plurality of bit lines, wherein the plurality of bit lines are parallel to the plurality of first conductive lines, and at least four adjacent ones of the plurality of bit lines are located between two adjacent and aligned ones of the plurality of first conductive lines.

9. The memory of claim 7, wherein each of the plurality of first conductive lines is electrically connected to and contacts two of the plurality of gate electrode lines.

10. The memory of claim 7, wherein a first thickness of each of the plurality of gate electrode lines is 0.5 to 2 times as large as a second thickness of each of the plurality of first conductive lines, a first width of each of the plurality of gate electrode lines is 0.5 to 1 times a second width of each of the plurality of first conductive lines, and the first width of each of the plurality of gate electrode lines is 0.1 to 0.2 times as large as a length of each of the plurality of first conductive lines.

11. The memory of claim 7, wherein each of the plurality of second conductive lines is coupled to two of the plurality of gate electrode lines, and each of the plurality of second conductive lines at least partially overlaps the two gate electrode lines of the plurality of gate electrode lines.

12. The memory of claim 7, wherein the plurality of second conductive lines are respectively word lines, and the plurality of second conductive lines are parallel to the plurality of gate electrode lines.

13. The memory of claim 7, wherein a first thickness of each of the plurality of gate electrode lines is 0.1 to 0.5 as large as a third thickness of each of the plurality of second conductive lines, and a first width of each of the plurality of gate electrode lines is 0.2 to 0.5 times as large as a width of each of the plurality of second conductive lines.

14. The memory of claim 7, wherein each of the plurality of second conductive lines completely overlaps two of the plurality of gate electrode lines.

15. The memory of claim 7, wherein the plurality of first conductive lines are perpendicular to the plurality of second conductive lines, one of the plurality of first conductive lines overlapping one of the plurality of second conductive lines are staggered and non-aligned with another of the plurality of first conductive lines overlapping another of the plurality of second conductive lines.

* * * * *